United States Patent
Lee et al.

(10) Patent No.: US 12,477,933 B2
(45) Date of Patent: Nov. 18, 2025

(54) APPARATUS FOR MANUFACTURING DISPLAY DEVICE AND METHOD OF MANUFACTURING DISPLAY DEVICE

(71) Applicant: Samsung Display Co., Ltd., Yongin-si (KR)

(72) Inventors: Hyunwoo Lee, Yongin-si (KR); Wonjun Lee, Yongin-si (KR); Junhyeong Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 427 days.

(21) Appl. No.: 18/189,086

(22) Filed: Mar. 23, 2023

(65) Prior Publication Data

US 2024/0016038 A1   Jan. 11, 2024

(30) Foreign Application Priority Data

Jul. 8, 2022   (KR) ......................... 10-2022-0084615

(51) Int. Cl.
*H10K 59/80*   (2023.01)
*H10K 71/00*   (2023.01)
*H10K 102/00*  (2023.01)

(52) U.S. Cl.
CPC ........... *H10K 59/873* (2023.02); *H10K 71/00* (2023.02); *B65H 2801/61* (2013.01); *H10K 2102/311* (2023.02)

(58) Field of Classification Search
CPC ............... H10K 59/873; H10K 71/00; H10K 2102/311; H10K 77/111; H10K 59/1201; H10K 59/87; H10K 50/841
See application file for complete search history.

(56) References Cited

U.S. PATENT DOCUMENTS

| | | | |
|---|---|---|---|
| 9,327,312 B2 | 5/2016 | Kim et al. | |
| 10,224,498 B2 | 3/2019 | Um et al. | |
| 2022/0250870 A1* | 8/2022 | Liu | B05C 9/12 |
| 2024/0206265 A1* | 6/2024 | Lee | H10K 59/88 |

FOREIGN PATENT DOCUMENTS

| | | |
|---|---|---|
| JP | 2004-225003 A | 8/2004 |
| KR | 10-2014-0147540 A | 12/2014 |
| KR | 10-1493410 B1 | 2/2015 |
| KR | 10-2405120 B1 | 6/2022 |

* cited by examiner

*Primary Examiner* — Joe E. Schoenholtz
(74) *Attorney, Agent, or Firm* — Womble Bond Dickinson (US) LLP

(57) ABSTRACT

An apparatus for manufacturing a display device includes: a display panel comprising a display area, an adjacent area surrounding the display area, and a bending area extending from one side of the adjacent area; a stage on which the display panel is located; a first applicator configured to discharge a first material to the bending area of the display panel; and a second applicator configured to discharge a second material to the adjacent area of the display panel, the second material being different from the first material, wherein a position of at least one of the first applicator or the second applicator is changeable in a first direction.

20 Claims, 16 Drawing Sheets

APPARATUS FOR MANUFACTURING DISPLAY DEVICE AND METHOD OF MANUFACTURING DISPLAY DEVICE

CROSS-REFERENCE TO RELATED APPLICATION

The present application claims priority to and the benefit of Korean Patent Application No. 10-2022-0084615, filed on Jul. 8, 2022, in the Korean Intellectual Property Office, the entire disclosure of which is incorporated herein by reference.

BACKGROUND

1. Field

Aspects of one or more embodiments relate to an apparatus for manufacturing a display device and a method of manufacturing a display device.

2. Description of the Related Art

Recently, electronic devices have been widely used. Electronic devices are used in various applications, such as mobile electronic devices and fixed electronic devices. Such electronic devices include display devices to display visual information, such as images or videos, to users in order to support various functions.

Recently, as other parts for driving display devices have been miniaturized, the proportion occupied by display devices in electronic devices has gradually been increasing. A structure that is bendable to have a certain angle from a flat state or is foldable about an axis is also under development.

In general, a display device includes a display panel. The display panel includes a display area enabling images to be displayed and a peripheral area that is a non-display area adjacent to the display area. In the display panel, by bending at least a portion of the peripheral area, visibility at various angles may be improved, or the area of the non-display area may be reduced.

The above information disclosed in this Background section is only for enhancement of understanding of the background and therefore the information discussed in this Background section does not necessarily constitute prior art.

SUMMARY

Aspects of one or more embodiments include an apparatus for manufacturing a display device and a method of manufacturing a display device, in which applicators simultaneously (or concurrently) apply materials to a neighboring area and a bending area of a display panel, and thus, a manufacturing process time may be relatively reduced. However, this is merely an example, and the scope of embodiments according to the present disclosure are not limited thereby.

Additional aspects will be set forth in part in the description which follows and, in part, will be apparent from the description, or may be learned by practice of the presented embodiments of the disclosure.

According to one or more embodiments, an apparatus for manufacturing a display device includes a display panel including a display area, an adjacent area surrounding the display area, and a bending area extending from one side of the adjacent area, a stage on which the display panel is located, a first applicator configured to discharge a first material to the bending area of the display panel, and a second applicator configured to discharge a second material to the adjacent area of the display panel, the second material being different from the first material, wherein a position of at least one of the first applicator or the second applicator is changeable in a first direction.

According some embodiments, the display panel may further include a dam on at least a portion of the adjacent area and at least a portion of the bending area.

According to some embodiments, the dam may include a same material as the first material.

According to some embodiments, the adjacent area may include a first portion adjacent to the display area, and a second portion between the first portion and the dam.

According to some embodiments, the bending area may include a third portion and a fourth portion, the third portion may be adjacent to the dam, and a shortest distance from the third portion to the adjacent area in the first direction may be less than a shortest distance from the fourth part to the adjacent area in a plan view.

According to some embodiments, the second applicator may apply the second material onto the first portion of the adjacent area at a same time when the first applicator applies the first material onto the third portion of the bending area.

According to some embodiments, a moving speed of the stage may be changeable.

According to some embodiments, a discharge amount of the first material discharged from the first applicator may be adjusted according to a moving speed of the stage.

According to some embodiments, a method of manufacturing a display device may include placing a display panel on a stage, the display panel including a display area, an adjacent area surrounding the display area, and a bending area extending from one side of the adjacent area, forming a dam on at least a portion of the adjacent area and at least a portion of the bending area, and applying a first material onto the bending area and a second material onto the adjacent area, the second material being different from the first material.

According to some embodiments, the dam may include a same material as the first material.

According to some embodiments, the first material may be discharged from a first applicator.

According to some embodiments, the second material may be discharged from a second applicator.

According to some embodiments, the adjacent area may include a first portion adjacent to the display area, and a second portion between the first portion and the dam.

According to some embodiments, the bending area may include a third portion and a fourth portion, the third portion may be adjacent to the dam, and a shortest distance from the third portion to the adjacent area in a first direction may be less than a shortest distance from the fourth part to the adjacent area in a plan view.

According to some embodiments, the applying of the first material onto the bending area and the second material onto the adjacent area may include discharging the first material from the first applicator to the third portion of the bending area, and discharging the second material from the second applicator to the first portion of the adjacent area.

According to some embodiments, in the applying of the first material onto the bending area and the second material onto the adjacent area, the first material and the second material may be simultaneously (or concurrently) discharged from the first applicator and the second applicator, respectively.

According to some embodiments, the method may further include, after the applying of the first material onto the bending area and the second material onto the adjacent area, discharging the second material from the second applicator to the second portion of the adjacent area, and discharging the first material from the first applicator to the fourth portion of the bending area.

According to some embodiments, the stage may move in a second direction crossing the first direction.

According to some embodiments, a moving speed of the stage may be changeable.

According to some embodiments, a discharge amount of the first material discharged from the first applicator may be adjusted according to a moving speed of the stage.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
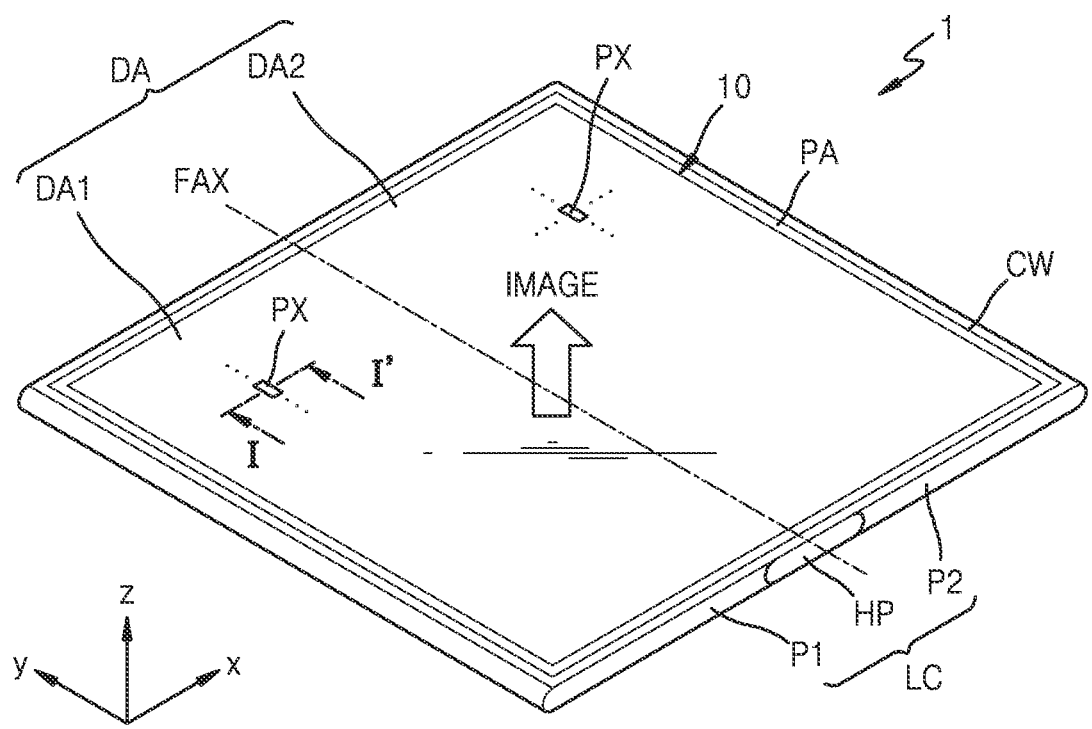
FIGS. 1 and 2 are perspective views schematically illustrating a display device according to some embodiments of the present disclosure.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, aspects of some embodiments will be described in more detail with reference to the accompanying drawings. When describing embodiments with reference to the accompanying drawings, the same or corresponding elements are denoted by the same reference numerals.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "include" and/or "comprise" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

In this specification, the expression "A and/or B" indicates only A, only B, or both A and B. In this specification, the expression "at least one of A and B" indicates only A, only B, or both A and B.

It will be further understood that when layers, regions, or elements are referred to as being connected to each other, they may be directly connected to each other or indirectly connected to each other with intervening layers, regions, or elements therebetween. For example, when layers, regions, or elements are referred to as being electrically connected to each other, they may be directly electrically connected to each other or indirectly electrically connected to each other with intervening layers, regions, or elements therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Figure 2:
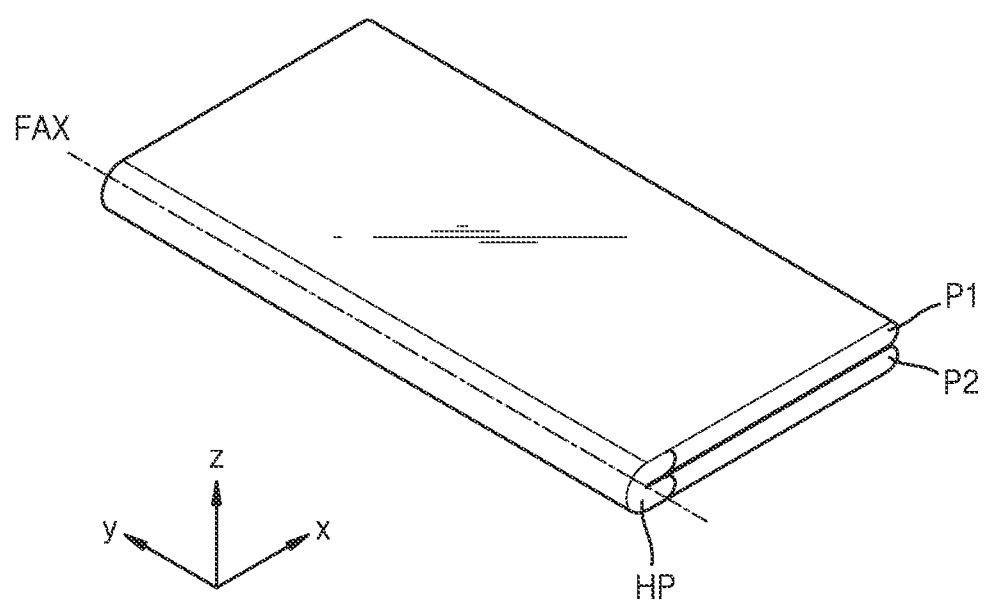

FIGS. 1 and 2 are perspective views schematically illustrating a display device 1 according to some embodiments of the present disclosure. For example, FIG. 1 illustrates the display device 1 in an unfolded state, and FIG. 2 illustrates the display device 1 in a folded state.

Referring to FIGS. 1 and 2, the display device 1 is configured to display a moving image or a still image. The display device 1 may be used as display screens of portable electronic devices, such as mobile phones, smartphones, tablet personal computers (PCs), mobile communication terminals, electronic organizers, e-books, portable multimedia players (PMPs), navigations, and ultra mobile PCs (UMPCs). Also, the display device 1 may be used as display screens of various products, such as televisions, laptops, monitors, billboards, and Internet of things (IoT) devices. In addition, the display device 1 according to some embodiments may be used in wearable devices, such as smart watches, watch phones, glasses-type displays, and head mounted displays (HMDs). Also, the display device 1 according to some embodiments may be used in dashboards of automobiles, center information displays (CIDs) on the center fascia or dashboards of automobiles, room mirror displays replacing side mirrors of automobiles, and displays on the rear sides of front seats to serve as entertainment devices for backseat passengers of automobiles.

The display device 1 may have a rectangular shape (or relatively rectangular shape (e.g., with rounded corners, etc.)), as illustrated in FIG. 1. For example, as illustrated in FIG. 1, the display device 1 may have a rectangular planar shape, as a whole, which has a short side extending in a first direction (e.g., the x direction or the −x direction) and a long side extending in a second direction (e.g., the y direction or the −y direction). According to some embodiments, a portion in which the short side extending in the first direction (e.g., the x direction or the −x direction) meets the long side extending in the second direction (e.g., the y direction or the −y direction) may have a right angle shape or a round shape with a certain curvature. The planar shape of the display device 1 is not limited to the rectangular shape, and may be other polygonal, circular, or elliptical shapes.

The display device 1 may include a lower cover LC, a display panel 10, and a cover window CW. The lower cover LC may form a lower surface of the display device 1. The lower cover LC may include plastic and/or metal. The lower cover LC may include a first portion P1 and a second portion P2, which support the display panel 10. The lower cover LC may be foldable about a folding axis FAX defined between the first portion P1 and the second portion P2. According to some embodiments, the lower cover LC may further include a hinge portion HP. The hinge portion HP may be between the first portion P1 and the second portion P2.

The display panel 10 may include a display area DA and a peripheral area PA. The display area DA may enable images to be displayed. Pixels PX may be arranged in the display area DA. The display panel 10 may display images by using light emitted from the pixels PX. The pixels PX may each emit light by using a display element. According to some embodiments, the pixels PX may each emit red light, green light, or blue light. According to some embodiments, the pixels PX may each emit red light, green light, blue light, or white light.

The peripheral area PA may be a non-display area that does not provide images. The peripheral area PA may at least partially surround the display area DA. For example, the peripheral area PA may completely surround the display area DA. A driver configured to provide an electrical signal to the pixels PX and/or a power line configured to supply power to the pixels PX may be arranged in the peripheral area PA. For example, a scan driver configured to apply a scan signal to the pixels PX may be arranged in the peripheral area PA. Also, a data driver configured to apply a data signal to the pixels PX may be arranged in the peripheral area PA.

The display area DA may include a first display area DA1 and a second display area DA2 respectively on both sides of the folding axis FAX crossing the display area DA. The first display area DA1 and the second display area DA2 may be respectively located on the first portion P1 and the second portion P2 of the lower cover LC. The display panel 10 may provide a first image and a second image by using pieces of light emitted from the pixels PX respectively arranged in the first display area DA1 and the second display area DA2. According to some embodiments, the first image and the second image may be portions of one image provided through the display area DA of the display panel 10. Alternatively, according to some embodiments, the display panel 10 may provide a first image and a second image, which are independent of each other.

The display panel 10 may be foldable about the folding axis FAX. According to some embodiments, when the display panel 10 is folded, the first display area DA1 and the second display area DA2 of the display panel 10 may face each other. Alternatively, when the display panel 10 is folded, the first display area DA1 and the second display area DA2 of the display panel 10 may face directions opposite to each other.

That is, according to some embodiments, the display panel 10 may be in-foldable or out-foldable about the folding axis FAX. The term "in-folding" means that the display panel 10 is folded in the +z direction with respect to the folding axis FAX, and the term "out-folding" means that the display panel 10 is folded in the −z direction with respect to the folding axis FAX. In other words, the term "in-folding" means that the upper surfaces of the cover window CW located on the display panel 10 are folded to face each other, and the term "out-folding" may mean that the lower surfaces of the cover window CW are folded to face each other. In this case, the lower surface of the cover window CW may refer to a surface closer to a substrate (see 100 of FIG. 3) in the z direction than the upper surface of the cover window CW.

Although FIGS. 1 and 2 illustrate a case where the folding axis FAX extends in the second direction (e.g., the y direction or the −y direction), the disclosure is not limited thereto. According to some embodiments, the folding axis FAX may extend in the first direction (e.g., the x direction or the −x direction) crossing the second direction (e.g., the y direction or the −y direction). Alternatively, the folding axis FAX on the xy plane may also extend in a direction crossing the first direction (e.g., the x direction or the −x direction) and the second direction (e.g., the y direction or the −y direction).

Also, although FIGS. 1 and 2 illustrate one folding axis FAX, the disclosure is not limited thereto. According to some embodiments, the display panel 10 may be foldable about two folding axes FAX crossing the display area DA. For example, when the display panel 10 is folded about two folding axes FAX, the display panel 10 may be in-folded about one folding axis FAX and out-folded about the other folding axis FAX. Alternatively, the display panel 10 may be all in-folded or out-folded about the two folding axes FAX. According to some embodiments, the display panel 10 may be foldable about a plurality of folding axes FAX crossing the display area DA. In this case, the display panel 10 may be in-folded or out-folded about the respective folding axes FAX.

The cover window CW may be located on the display panel 10 to cover the display panel 10. The cover window CW may be foldable or bendable according to external force without occurrence of cracks or the like. When the display panel 10 is folded about the folding axis FAX, the cover window CW may also be folded to cover the display panel 10.

Figure 3:
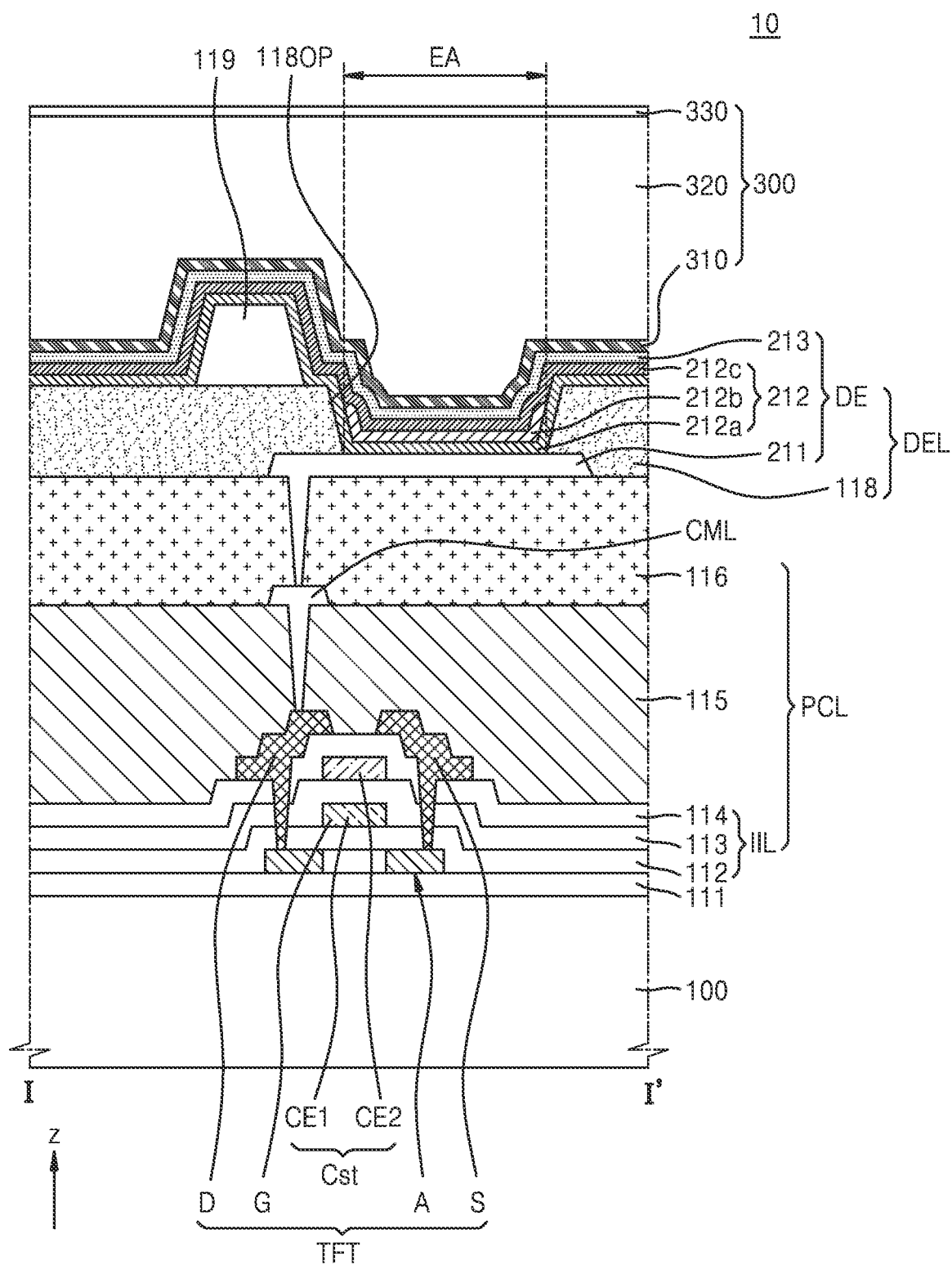
FIG. 3 is a cross-sectional view schematically illustrating a display panel according to some embodiments of the present disclosure.

FIG. 3 is a cross-sectional view schematically illustrating a display panel 10 according to some embodiments of the present disclosure. For example, FIG. 3 is a cross-sectional view of the display panel 10 taken along the line I-I' of FIG. 1.

Referring to FIG. 3, the display panel 10 may include a substrate 100, a buffer layer 111, a pixel circuit layer PCL, a display element layer DEL, and an encapsulation layer 300.

The substrate 100 may include glass or polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. According to some embodiments, the substrate 100 may have a multi-layer structure including a base layer and a barrier layer each including the polymer resin described above. The substrate 100 including the polymer resin may be flexible, rollable, and bendable.

The buffer layer 111 may be located on the substrate 100. The buffer layer 111 may include an inorganic insulating material, such as silicon nitride, silicon oxynitride, and silicon oxide, and may include a single layer or layers including the inorganic insulating material described above.

The pixel circuit layer PCL may be located on the buffer layer 111. The pixel circuit layer PCL may include a thin-film transistor TFT included in a pixel circuit, and may include an inorganic insulating layer IIL, a first planarization layer 115, and a second planarization layer 116, which are located below and/or above elements of the thin-film transistor TFT. The inorganic insulating layer IIL may include a first gate insulating layer 112, a second gate insulating layer 113, and an interlayer insulating layer 114.

The thin-film transistor TFT may include a semiconductor layer A, and the semiconductor layer A may include polysilicon. Alternatively, the semiconductor layer A may include amorphous silicon, an oxide semiconductor, or an organic semiconductor. The semiconductor layer A may include a channel region, and a drain region and a source region respectively on both sides of the channel region. A gate electrode G may overlap the channel region.

The gate electrode G may include a low-resistance metal material. The gate electrode G may include a conductive material including molybdenum (Mo), aluminum (Al), copper (Cu), titanium (Ti), and the like, and may include a single layer or layers including the conductive material described above.

The first gate insulating layer 112 between the semiconductor layer A and the gate electrode G may include an inorganic insulating material, such as silicon oxide ($SiO_2$), silicon nitride ($SiN_x$), silicon (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be ZnO and/or $ZnO_2$.

The second gate insulating layer 113 may be provided to cover the gate electrode G. Similar to the first gate insulating layer 112, the second gate insulating layer 113 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be ZnO and/or $ZnO_2$.

An upper electrode CE2 of a storage capacitor Cst may be located on the second gate insulating layer 113. The upper electrode CE2 may overlap the gate electrode G therebelow. In this case, the gate electrode G and the upper electrode CE2 overlapping each other with the second gate insulating layer 113 therebetween may constitute the storage capacitor Cst. That is, the gate electrode G may function as a lower electrode CE1 of the storage capacitor Cst. As such, the storage capacitor Cst may overlap the thin-film transistor TFT. Alternatively, the storage capacitor Cst may not overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or layers including the material described above.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be ZnO and/or $ZnO_2$. The interlayer insulating layer 114 may include a single layer or layers including the inorganic insulating material described above.

A drain electrode D and a source electrode S may be respectively located on the interlayer insulating layer 114. The drain electrode D and the source electrode S may each include a material having good conductivity. The drain electrode D and the source electrode S may each include a conductive material including molybdenum (Mo), aluminum (Al), copper (Cu), titanium (Ti), and the like, and may include a single layer or layers including the conductive material described above. According to some embodiments, the drain electrode D and the source electrode S may each have a multilayer structure of Ti/Al/Ti.

The first planarization layer 115 may be arranged to cover the drain electrode D and the source electrode S. The first planarization layer 115 may include an organic insulating layer. The first planarization layer 115 may include an organic insulating material selected from general-purpose polymer, such as polymethylmethacrylate (PMMA) or polystyrene (PS), polymer derivatives having a phenolic group, acrylic polymer, imide-based polymer, aryl ether-based polymer, amide-based polymer, fluorine-based polymer, p-xylene-based polymer, vinyl alcohol-based polymer, and any blend thereof.

A connection electrode CML may be located on the first planarization layer 115. In this case, the connection electrode CML may be connected to the drain electrode D or the source electrode S through a contact hole of the first planarization layer 115. The connection electrode CML may include a material having good conductivity. The connection electrode CML may include a conductive material including molybdenum (Mo), aluminum (Al), copper (Cu), titanium (Ti), and the like, and may include a single layer or layers including the conductive material described above. According to some embodiments, the connection electrode CML may have a multilayer structure of Ti/Al/Ti.

The second planarization layer 116 may be arranged to cover the connection electrode CML. The second planarization layer 116 may include an organic insulating material. The second planarization layer 116 may include an organic insulating material selected from general-purpose polymer, such as PMMA or PS, polymer derivatives having a phenolic group, acrylic polymer, imide-based polymer, aryl ether-based polymer, amide-based polymer, fluorine-based polymer, p-xylene-based polymer, vinyl alcohol-based polymer, and any blend thereof.

The display element layer DEL may be located on the pixel circuit layer PCL. The display element layer DEL may include a display element DE. The display element DE may be an organic light-emitting diode (OLED). A pixel electrode 211 of the display element DE may be electrically connected to the connection electrode CML through a contact hole of the second planarization layer 116.

The pixel electrode 211 may include a conductive oxide, such as indium tin oxide (ITO), indium zinc oxide (IZO), zinc oxide (ZnO), indium oxide (In$_2$O$_3$), indium gallium oxide (IGO), or aluminum zinc oxide (AZO). According to some embodiments, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. Alternatively, the pixel electrode 211 may further include a layer including ITO, IZO, ZnO, or In$_2$O$_3$ above and/or below the reflective layer.

A pixel defining layer 118 having an opening 1180P exposing the central portion of the pixel electrode 211 may be located on the pixel electrode 211. The pixel defining layer 118 may include an organic insulating material and/or an inorganic insulating material. The opening 1180P may define an emission area for light emitted from the display element DE. For example, the width of the opening 1180P may correspond to the width of the emission area EA.

According to some embodiments, the pixel defining layer 118 may include a light blocking material and may be provided in black. The light blocking material may include carbon black, carbon nanotubes, a resin or paste including black dye, metal particles (e.g., nickel, aluminum, molybdenum, and any alloy thereof), metal oxide particles (e.g., chromium oxide), or metal nitride particles (e.g., chromium nitride). When the pixel defining layer 118 includes a light blocking material, the reflection of external light due to the metal structures below the pixel defining layer 118 may be reduced.

A spacer 119 may be located on the pixel defining layer 118. The spacer 119 may prevent damage to the substrate 100 in the method of manufacturing the display device. A mask sheet may be used to manufacture the display panel. At this time, when the mask sheet enters the inside of the opening 1180P of the pixel defining layer 118, or when a deposition material is deposited on the substrate 100 in close contact with the pixel defining layer 118, a defect in which a portion of the substrate 100 is damaged or broken by the mask sheet may be prevented.

The spacer 119 may include an organic insulating material, such as polyimide. Alternatively, the spacer 119 may include an inorganic insulating material, such as silicon nitride or silicon oxide, or may include an organic insulating material and an inorganic insulating material.

According to some embodiments, the spacer 119 may include a material that is different from a material of the pixel defining layer 118. Alternatively, the spacer 119 may include the same material as that of the pixel defining layer 118. In this case, the pixel defining layer 118 and the spacer 119 may be formed together in a mask process using a halftone mask or the like.

An intermediate layer 212 may be located on the pixel defining layer 118. The intermediate layer 212 may include an emission layer 212b arranged in the opening 1180P of the pixel defining layer 118. The emission layer 212b may include a high molecular weight organic material or a low molecular weight organic material that emits light of a certain color.

A first functional layer 212a and a second functional layer 212c may be located below and above the emission layer 212b, respectively. The first functional layer 212a may include, for example, a hole transport layer (HTL), or may include an HTL and a hole injection layer (HIL). The second functional layer 212c is an optional element located on the emission layer 212b. The second functional layer 212c may include an electron transport layer (ETL) and/or an electron injection layer (EIL). The first functional layer 212a and/or the second functional layer 212c may be a common layer completely covering the substrate 100, like an opposite electrode 213 to be described below.

The opposite electrode 213 may include a conductive material having a low work function. For example, the opposite electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 213 may further include a layer including ITO, IZO, ZnO, or In$_2$O$_3$ on the (semi)transparent layer including the material described above.

In some embodiments, a capping layer may be further located on the opposite electrode 213. The capping layer may include LiF, an inorganic material, and/or an organic material.

The encapsulation layer 300 may be located on the opposite electrode 213. According to some embodiments, the encapsulation layer 300 may include at least one inorganic encapsulation layer and at least one organic encapsulation layer. FIG. 3 illustrates that the encapsulation layer 300 includes a first inorganic encapsulation layer 310, an organic encapsulation layer 320, and a second inorganic encapsulation layer 330, which are sequentially stacked in this stated order.

The first inorganic encapsulation layer 310 and the second inorganic encapsulation layer 330 may each include at least one inorganic material selected from aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include acrylic resin, epoxy-based resin, polyimide, polyethylene, and the like. According to some embodiments, the organic encapsulation layer 320 may include acrylate.

A touch sensor layer may be located on the encapsulation layer 300. The touch sensor layer may be configured to obtain coordinate information according to an external input, for example, a touch event. Hereinafter, a case where the display panel includes the touch sensor layer will be mainly described, but the disclosure is not limited thereto and the touch sensor layer may be omitted.

Figure 4:
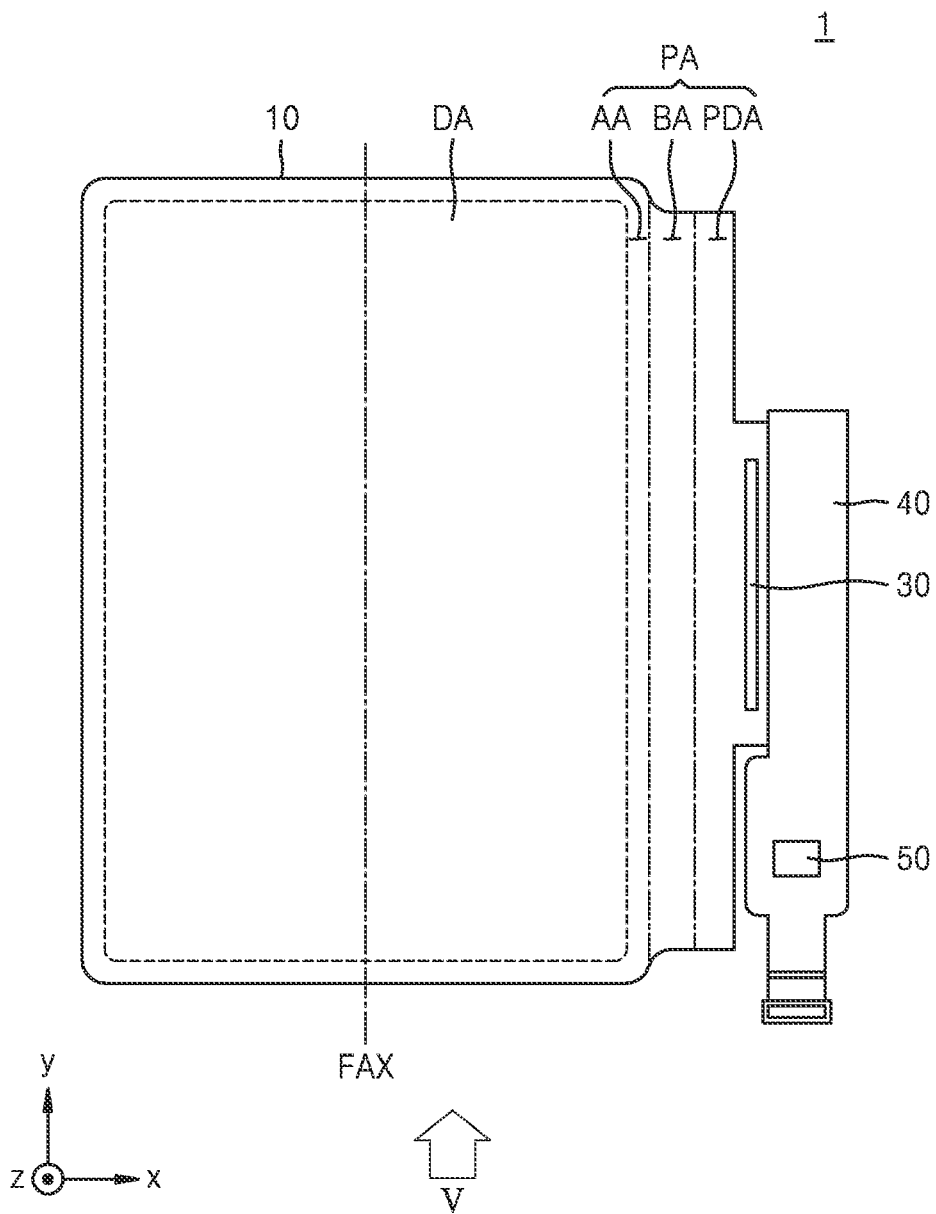
FIG. 4 is a plan view schematically illustrating a portion of a display device, according to some embodiments of the present disclosure.
Figure 5:
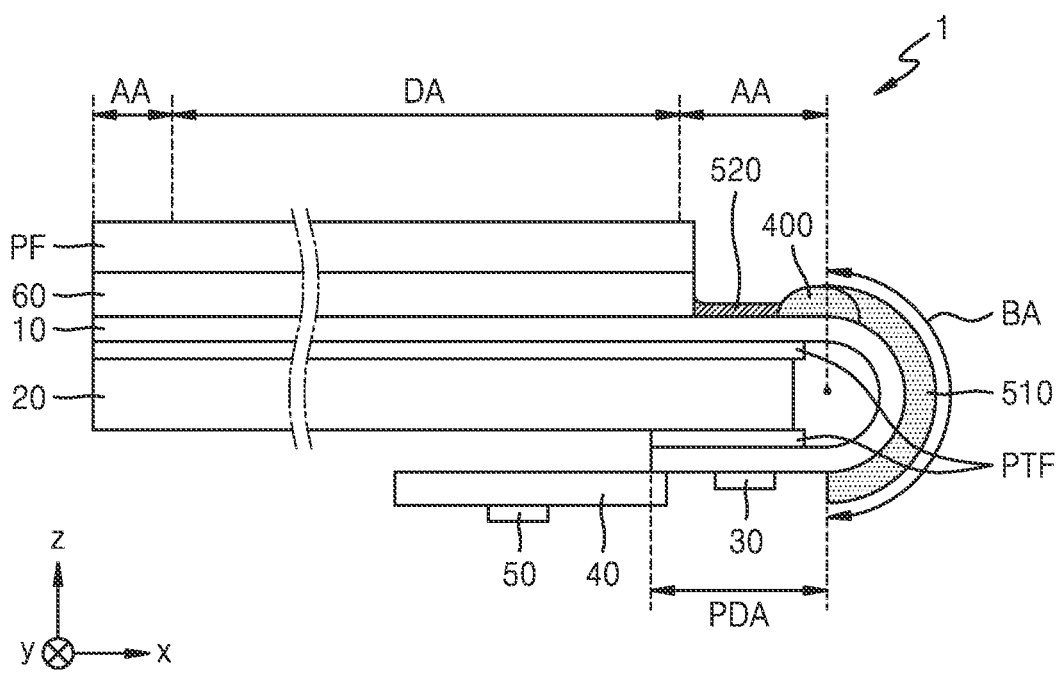
FIGS. 5 and 6 are side views schematically illustrating the display device including elements illustrated in FIG. 4 according to some embodiments of the present disclosure.
Figure 6:
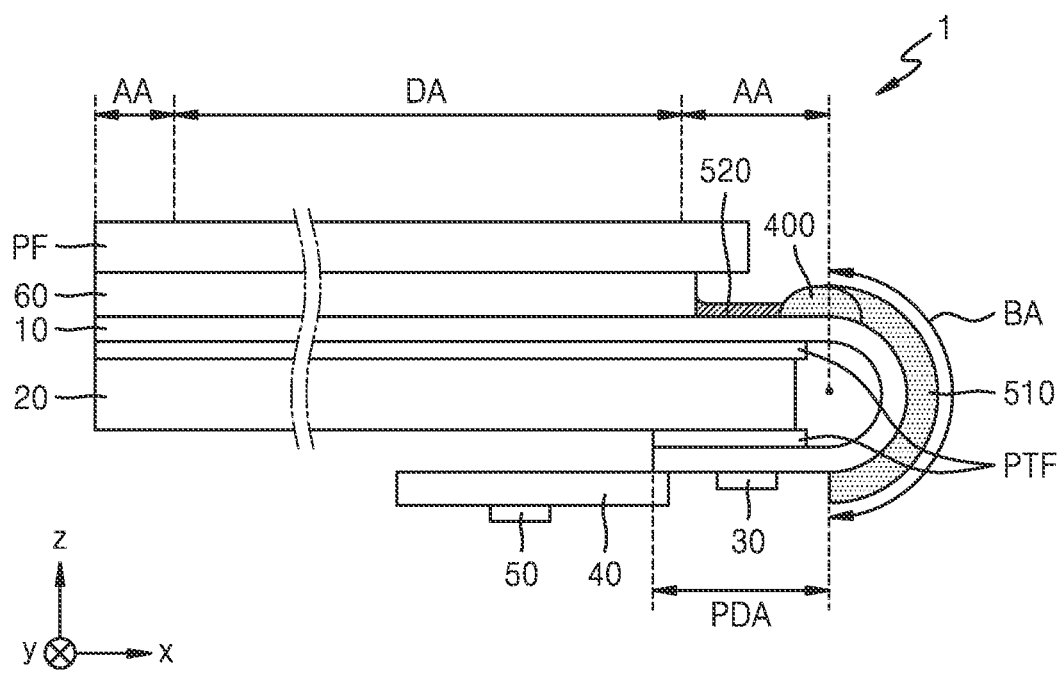

FIG. 4 is a plan view schematically illustrating a portion of a display device 1, according to some embodiments of the present disclosure. FIGS. 5 and 6 are side views schematically illustrating the display device 1 including elements illustrated in FIG. 4. FIGS. 5 and 6 are diagrams of the display device 1 when viewed from a V direction of FIG. 4. Also, FIGS. 5 and 6 illustrate that a display panel 10 is flexible, and thus the display panel 10 has a bent shape in a bending area BA.

Referring to FIGS. 4, 5, and 6, the display device 1 may include the display panel 10, an optical functional layer 60, a first protective film PF, a display driver 30, a display circuit board 40, a touch sensor driver 50, a cushion layer 20, a second protective film PTF, a bending protective layer 510, and an organic material layer 520.

The display panel 10 may be configured to display information processed by the display device 1. For example, the display panel 10 may be configured to display execution screen information of an application running on the display device 1 or user interface (UI) and graphic user interface (GUI) information according to the execution screen information.

The display panel 10 may include a display element. For example, the display panel 10 may be an organic light-emitting display panel using an organic light-emitting diode, a micro light-emitting diode (LED) display panel using micro LED, a quantum dot light-emitting display panel using a quantum dot light-emitting diode including a quantum dot emission layer, or an inorganic light-emitting display panel using an inorganic light-emitting element including an inorganic semiconductor. Hereinafter, a case in which the display panel 10 is an organic light-emitting display panel using an organic LED as a display element will be described in detail.

As described above, the display panel 10 may include a display area DA and a peripheral area PA. The peripheral area PA may include an adjacent area AA adjacent to the display area DA and surrounding the display area DA, a bending area BA extending from one side of the adjacent area AA and being bendable, and a pad area PDA connected to the bending area BA and in which drivers configured to apply a scan signal or a data signal may be arranged.

According to some embodiments, the bending area BA may extend from a portion through which a folding axis FAX does not pass in the adjacent area AA surrounding the display area DA. In other words, as illustrated in FIG. 4, the bending area BA may extend in the first direction (e.g., the x direction) in one of portions extending in the second direction (e.g., the y direction or the −y direction) in the adjacent area AA surrounding the display area DA. In other words, the bending area BA may be spaced apart from the folding axis FAX in the first direction (e.g., the x direction).

The display panel 10 may be bent in the bending area BA. In this case, at least portions of the lower surface of the display panel 10 may face each other, and the pad area PDA of the display panel 10 may be lower than the other portions of the display panel 10 (in the −z direction in FIG. 5). Accordingly, the area of the peripheral area PA recognized by a user may be reduced.

The optical functional layer 60 may be located on the display panel 10. The optical functional layer 60 may reduce the reflectance of light (external light) incident from the outside toward the display device 1, and/or may improve the color purity of light emitted from the display device 1. According to some embodiments, the optical functional layer 60 may include a retarder and/or a polarizer. The retarder may be a film-type retarder or a liquid crystal coating-type retarder, and may include a λ/2 retarder and/or a λ/4 retarder. The polarizer may be a film-type polarizer or a liquid crystal coating-type polarizer. The film-type retarder or polarizer may include a stretched synthetic resin film, and the liquid crystal coating-type retarder or polarizer may include liquid crystals arranged in a certain array. The retarder and the polarizer may each further include a protective film.

The display driver 30 may be located in the pad area PDA. The display driver may be configured to receive control signals and power supply voltages and generate and output signals and voltages for driving the display panel 10. The display driver 30 may include an integrated circuit (IC).

The display circuit board 40 may be electrically connected to the display panel 10. For example, the display circuit board 40 may be in contact with and connected to the pad area PDA of the display panel 10, and may be electrically connected to the pad area PDA of the display panel 10 by an anisotropic conductive film.

Examples of the display circuit board 40 may include a flexible printed circuit board (FPCB) or a rigid printed circuit board (PCB) that is rigid and is thus hardly bent. Alternatively, in some cases, the display circuit board 40 may be a composite PCB including both a rigid PCB and an FPCB.

According to some embodiments, the touch sensor driver 50 may be located on the display circuit board 40. The touch sensor driver 50 may include an IC. The touch sensor driver 50 may be bonded on the display circuit board 40. The touch sensor driver 50 may be electrically connected to sensor electrodes of the touch sensor layer of the display panel 10 through the display circuit board 40.

Of course, a power supply may be further located on the display circuit board 40. The power supply may be configured to supply a driving voltage for driving pixels of the display panel 10 and the display driver 30.

The second protective film PTF may be patterned and bonded to the lower surface of the display panel 10. In this case, the second protective film PTF may be bonded to a portion other than the bending area BA. As the display panel 10 is bent in the bending area BA, a portion of the second protective film PTF and another portion of the second protective film PTF may be arranged to face each other.

According to some embodiments, the first protective film PF may be located on the optical functional layer 60. The optical functional layer 60 and the first protective film PF may be sequentially located on the display panel 10 in this stated order. The optical functional layer 60 and the first protective film PF may be located on the display panel 10 in the display area DA.

According to some embodiments, the optical functional layer 60 and the first protective film PF in the display area DA may extend in the first direction (e.g., the x direction or the −x direction). In the adjacent area AA extending to the bending area BA, the first protective film PF and the optical functional layer 60 extending from the display area DA in the first direction (e.g., the x direction) may be cut off.

According to some embodiments, when the adjacent area AA in which the optical functional layer 60 and the first protective film PF do not extend is viewed from the cross-section (e.g., xz cross-section) of the third direction (e.g., the z direction or the −z-direction), the end of the optical functional layer 60 may be located on the same line as the end of the first protective film PF.

Alternatively, when the adjacent area AA in which the optical functional layer 60 and the first protective film PF do not extend is viewed from the cross-section (e.g., xz cross-section) of the third direction (e.g., the z direction or the −z-direction), the end of the first protective film PF may protrude further to the bending area BA than the end of the optical functional layer 60.

According to some embodiments, the cushion layer 20 may be between the second protective films PTF. The cushion layer 20 may absorb an external shock and prevent a damage to the display panel 10. The cushion layer 20 may include polymer resin, such as polyurethane, polycarbonate, polypropylene, polyethylene, or may include an elastic material, such as a sponge formed by foam-molding rubber, a urethane-based material, or an acrylic material.

According to some embodiments, the bending protective layer 510 may be arranged in the bending area BA of the display panel 10. The bending protective layer 510 may include a first material (see 515 of FIG. 7). The bending protective layer 510 may be spaced apart from the optical functional layer 60 in the first direction (e.g., the x direction). According to some embodiments, a connection line may be arranged in the bending area BA of the substrate 100. The connection line may be configured to transmit, to the display area DA, a signal provided from the display driver 30. The bending protective layer 510 protects the connection line, and may be a stress neutralization layer. The bending protective layer 510 may function as a black matrix of the display device 1 as well as a stress neutralization layer.

According to some embodiments, a dam 400 may be located on at least a portion of the adjacent area AA and at least a portion of the bending area BA. In other words, the dam 400 may be between the adjacent area AA and the bending area BA. The dam 400 may include the first material (see 515 of FIG. 7). The dam 400 in the adjacent area AA and the bending area BA may prevent the first material (see 515 of FIG. 7) applied onto the bending area BA from overflowing into the adjacent area AA, and may prevent a second material (see 525 of FIG. 7) applied on the adjacent area AA from overflowing into the bending area BA.

According to some embodiments, the organic material layer 520 may be located on the adjacent area AA of the display panel 10. The organic material layer 520 may be between the optical functional layer 60 and the dam 400. The organic material layer 520 may include the second material (see 525 of FIG. 7) that is different from the first material (see 515 of FIG. 7). The organic material layer 520 may be filled so that the upper surface of the display panel 10 between the optical functional layer 60 and the dam 400 is not exposed. In other words, the organic material layer 520 may fill a space between the optical functional layer 60 and the dam 400. The organic material layer 520 may protect the adjacent area AA and/or the display area DA from electrostatic discharge (ESD). A plurality of signal lines extending toward the display circuit board 40 may be arranged in the adjacent area AA, the bending area BA, and the pad area PDA of the display panel 10. In this case, the signal lines may be damaged due to ESD generated from the outside. ESD is a phenomenon in which a charged object and another object having a potential difference come into contact with each other to cause charge transfer in a short moment. A leakage current or the like due to ESD may cause malfunctions or defects of the display panel 10 and the display circuit board 40. According to some embodiments, ESD may be effectively prevented through the organic material layer 520.

Figure 7:
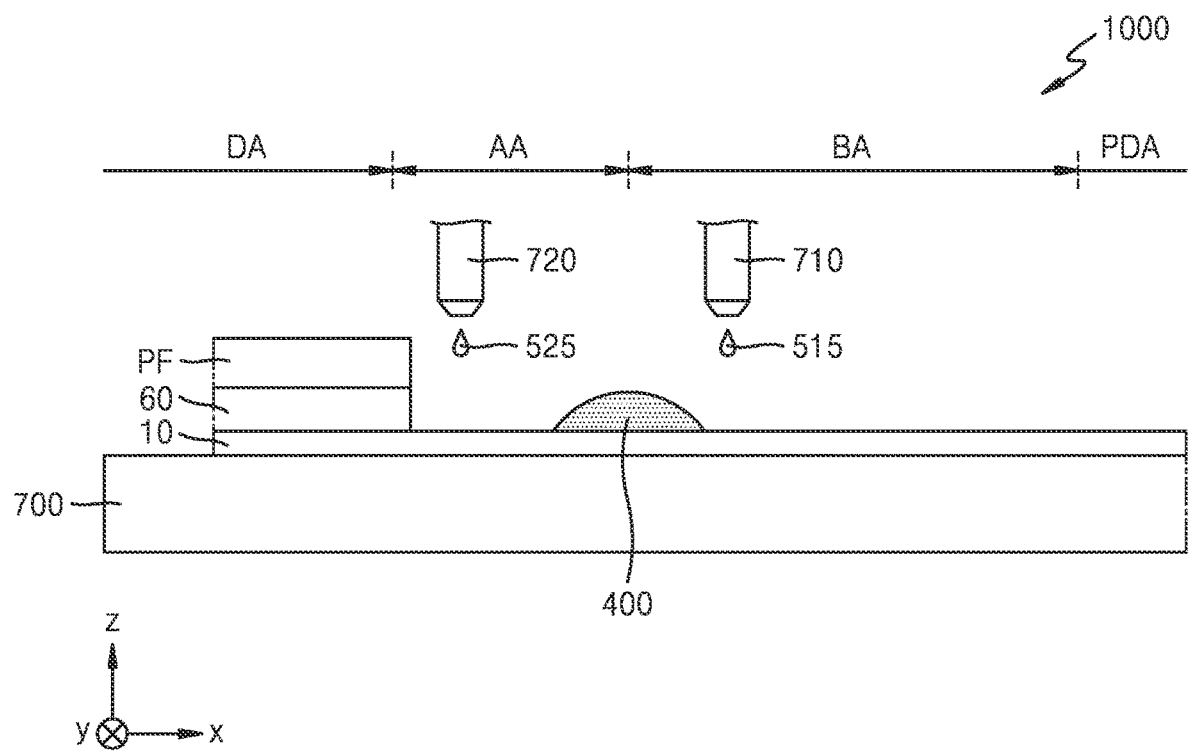
FIG. 7 is a side view schematically illustrating an apparatus for manufacturing a display device, according to some embodiments of the present disclosure.

FIG. 7 is a side view schematically illustrating an apparatus 1000 for manufacturing a display device 1, according to some embodiments of the present disclosure.

Referring to FIG. 7, the apparatus 1000 for manufacturing the display device 1 may include a stage 700, a first applicator 710, and a second applicator 720.

According to some embodiments, the first applicator 710 may discharge (or apply) a first material 515 onto a display panel 10. For example, the first applicator 710 may discharge (or apply) the first material 515 onto a bending area BA of the display panel 10. Accordingly, the first material 515 may be applied onto the bending area BA of the display panel 10. Also, the second applicator 720 may discharge (or apply), onto the display panel 10, a second material 525 that is different from the first material 515. For example, the second applicator 720 may discharge (or apply) the second material 525 onto an adjacent area AA of the display panel 10. Accordingly, the second material 525 may be applied onto the adjacent area AA of the display panel 10.

According to some embodiments, the display panel 10 may be located (or seated) on the stage 700. The stage 700 is movable in a second direction (e.g., the y direction or the −y direction). While the stage 700 moves, the first material 515 and the second material 525 respectively discharged from the first applicator 710 and the second applicator 720 may be applied onto the display panel 10. For example, while the stage 700 moves in the second direction (e.g., the y direction or the −y direction), the first material 515 discharged from the first applicator 710 may be applied onto the bending area BA. Also, while the stage 700 moves in the second direction (e.g., the y direction or the −y direction), the second material 525 discharged from the second applicator 720 may be applied onto the adjacent area AA. According to some embodiments, the moving speed of the stage 700 may be changed.

The first applicator 710 may apply the first material 515 onto at least a portion of the adjacent area AA and at least a portion of the bending area BA. In other words, the first applicator 710 may apply the first material 515 between the adjacent area AA and the bending area BA of the display panel 10. At this time, the first material 515 applied between the adjacent area AA and the bending area BA of the display panel 10 may be temporarily cured (e.g., spot-temporarily cured) at the same time as the application to form the dam 400. Accordingly, the dam 400 may be formed on at least a portion of the adjacent area AA and at least a portion of the bending area BA in the display panel 10.

According to some embodiments, the positions of the first applicator 710 and the second applicator 720 in the first direction (e.g., the x direction or the −x direction) may be changed. Because the positions of the first applicator 710 and the second applicator 720 in the first direction (e.g., the x direction or the −x direction) are changed, the first material 515 and the second material 525 may be simultaneously (or concurrently) applied onto the bending area BA and the adjacent area AA, respectively. For example, after the dam 400 including the first material 515 is formed on at least a portion of the adjacent area AA and at least a portion of the bending area BA in the display panel 10, the first applicator 710 may discharge (or apply) the first material 515 onto the bending area BA, and simultaneously (and concurrently), the second applicator 720 may discharge (or apply) the second material 525 onto the adjacent area AA.

According to some embodiments, the first applicator 710 may be located on the bending area BA. The first applicator 710 may discharge (or apply) the first material 515 onto the bending area BA. The discharged first material 515 may be applied onto the bending area BA of the display panel 10. The position of the first applicator 710 in the first direction (e.g., the x direction or the −x direction) may be changed.

According to some embodiments, the second applicator 720 may be located on the adjacent area AA. The second applicator 720 may discharge (or apply) the second material 525 onto the adjacent area AA. The discharged second material 525 may be applied onto the adjacent area AA of the display panel 10. The position of the second applicator 720 in the first direction (e.g., the x direction or the −x direction) may be changed.

Figure 8:
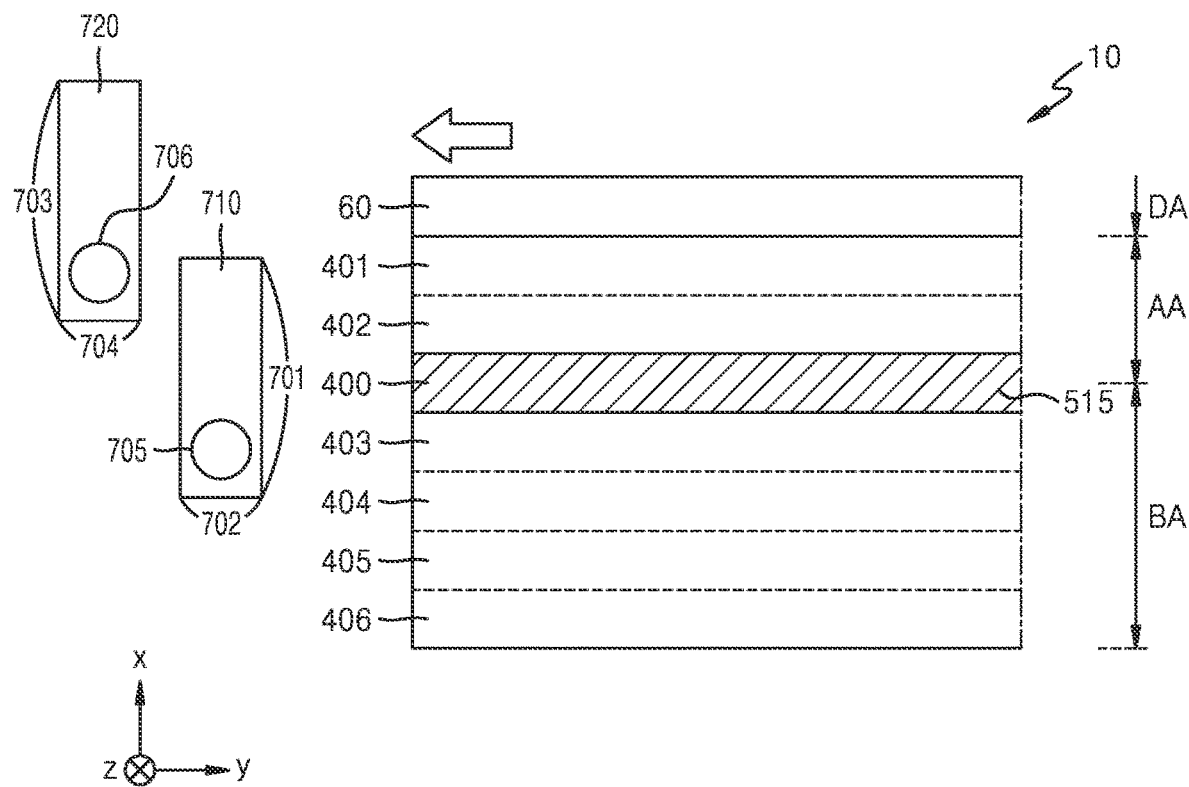
FIGS. 8 and 9 are diagrams schematically illustrating an apparatus for manufacturing a display device, according to some embodiments of the present disclosure.
Figure 9:
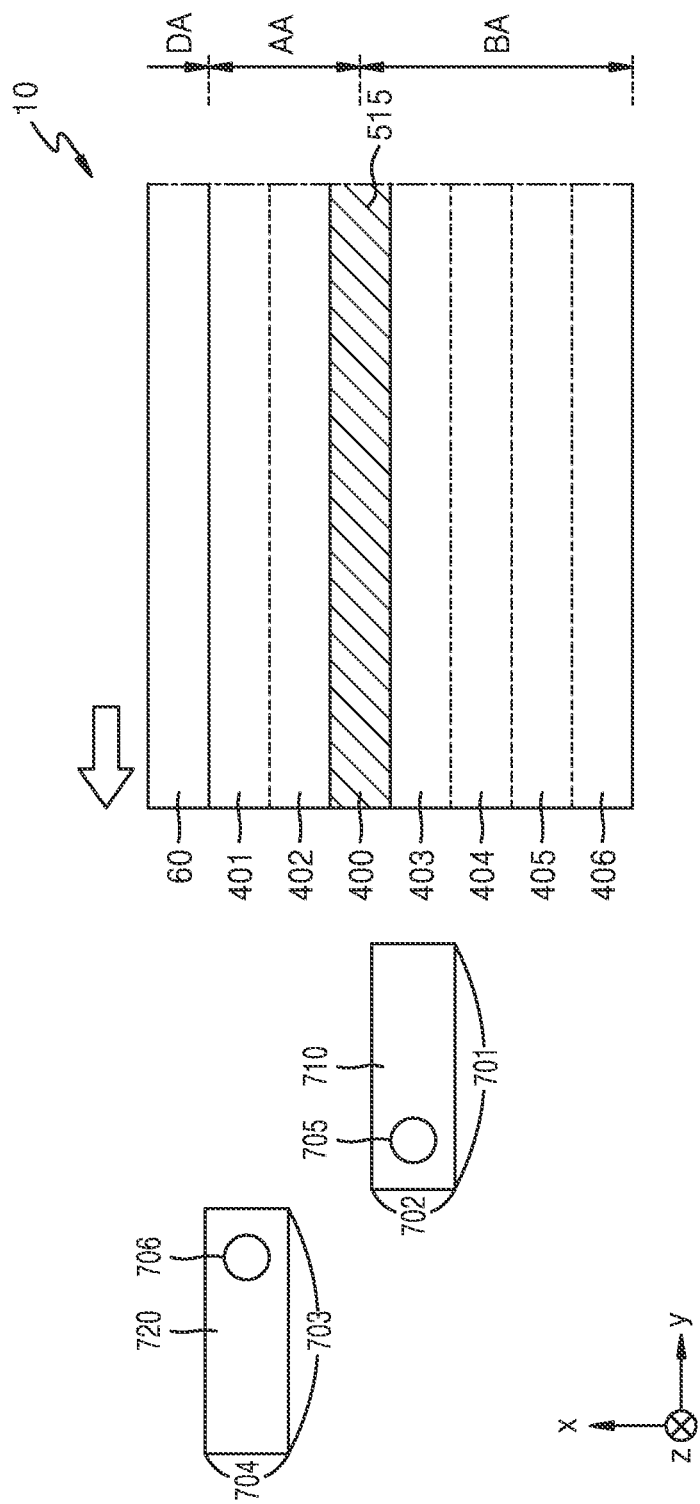

FIGS. 8 and 9 are diagrams schematically illustrating the apparatus (see 1000 of FIG. 7) for manufacturing the display device 1, according to some embodiments of the present disclosure. For example, FIGS. 8 and 9 are diagrams for describing the positional relationship of applicators and first to sixth portions 401 to 406 of the display panel 10.

Referring to FIGS. 8 and 9, the display panel 10 may include a display area DA, an adjacent area AA, and a bending area BA. The adjacent area AA may be between the display area DA and the bending area BA.

According to some embodiments, the adjacent area AA may include the first portion 401 and the second portion 402.

The first portion 401 and the second portion 402 of the adjacent area AA may extend in the second direction (e.g., the y direction or the −y direction). The first portion 401 of the adjacent area AA may be more adjacent to the display area DA than the second portion 402. For example, the first portion 401 of the adjacent area AA may be between the display area DA and the bending area BA, and the second portion of the adjacent area AA may be between the first portion 401 of the adjacent area AA and the bending area BA.

According to some embodiments, an optical functional layer 60 may be located on the display area DA adjacent to the adjacent area AA. In other words, the first portion 401 of the adjacent area AA may be a portion adjacent to the optical functional layer 60 of the display area DA. The second portion 402 of the adjacent area AA may be between the first portion 401 and a dam 400. In other words, the second portion 402 of the adjacent area AA may be a portion of the adjacent area AA other than the first portion 401 of the adjacent area AA and the dam 400.

According to some embodiments, the bending area BA may include a third portion 403, a fourth portion 404, a fifth portion 405, and a sixth portion 406. The third portion 403, the fourth portion 404, the fifth portion 405, and the sixth portion 406 of the bending area BA may extend in the second direction (e.g., the y direction or the −y direction). The third portion 403 may be adjacent to the dam 400. The fourth portion 404 may be adjacent to the third portion 403. In a plan view, the shortest distance from the third portion 403 to the adjacent area AA in the first direction (e.g., the x direction or the −x direction) may be less than the shortest distance from the fourth portion 404 to the adjacent area AA. That is, the third portion 403 may be located closer to the adjacent area AA than the fourth portion 404.

The fifth portion 405 of the bending area BA may be adjacent to the fourth portion 404. In a plan view, the shortest distance from the fourth portion 404 to the adjacent area AA in the first direction (e.g., the x direction or the −x direction) may be less than the shortest distance from the fifth portion 405 to the adjacent area AA. That is, the fourth portion 404 may be located closer to the adjacent area AA than the fifth portion 405.

The sixth portion 406 of the bending area BA may be adjacent to the fifth portion 405. In a plan view, the shortest distance from the fifth portion 405 to the adjacent area AA in the first direction (e.g., the x direction or the −x direction) may be less than the shortest distance from the sixth portion 406 to the adjacent area AA. That is, the fifth portion 405 may be located closer to the adjacent area AA than the sixth portion 406.

Accordingly, the third portion 403 of the bending area BA may be located closest to the adjacent area AA in the first direction (e.g., the x direction or the −x direction), and the fourth portion 404, the fifth portion 405, and the sixth portion 406 may be sequentially arranged in the first direction (e.g., the x direction or the −x direction) in this stated order.

According to some embodiments, the first applicator 710 and the second applicator 720 may each have a rectangular shape. The first applicator 710 may have a rectangular shape including a long side portion 701 and a short side portion 702. The second applicator 720 may have a rectangular shape including a long side portion 703 and a short side portion 704.

Referring to FIG. 8, the long side portion 701 of the first applicator 710 and the long side portion 703 of the second applicator 720 may each extend in the first direction (e.g., the x direction or the −x direction). Also, the long side portion 701 of the first applicator 710 and the long side portion 703 of the second applicator 720 may be spaced apart from each other in the second direction (e.g., the y direction or the −y direction). In this case, the position of the first applicator 710 in the first direction (e.g., the x direction or the −x direction) may be changed, and the position of the second applicator 720 in the first direction (e.g., the x direction or the −x direction) may be changed.

Referring to FIG. 9, the long side portion 701 of the first applicator 710 and the long side portion 703 of the second applicator 720 may each extend in the second direction (e.g., the y direction or the −y direction). Also, the long side portion 701 of the first applicator 710 and the long side portion 703 of the second applicator 720 may be spaced apart from each other in the first direction (e.g., the x direction or the −x direction). The position of the first applicator 710 in the first direction (e.g., the x direction or the −x direction) may be changed, and the position of the second applicator 720 in the first direction (e.g., the x direction or the −x direction) may be changed.

FIGS. 10 to 16 are diagrams schematically illustrating a method of manufacturing a display device 1, according to some embodiments of the present disclosure.

Hereinafter, the method of manufacturing the display device 1 will be described with reference to FIGS. 10 to 16.

Referring to FIGS. 10 to 16, the method of manufacturing the display device 1 may include: placing a display panel 10 on a stage (see 700 of FIG. 7), the display panel 10 including a display area DA, an adjacent area AA surrounding the display area DA, and a bending area BA extending from one side of the adjacent area AA; forming a dam 400 on at least a portion of the adjacent area AA and at least a portion of the bending area BA; and applying a first material 515 and a second material 525 onto the bending area BA and the adjacent area AA, respectively, the second material 525 being different from the first material 515.

First, the display panel 10 including the display area DA, the adjacent area AA surrounding the display area DA, and the bending area BA extending from one side of the adjacent area AA may be placed on the stage 700. A first applicator 710 and a second applicator 720 may be located on the stage 700 and the display panel 10.

Figure 10:
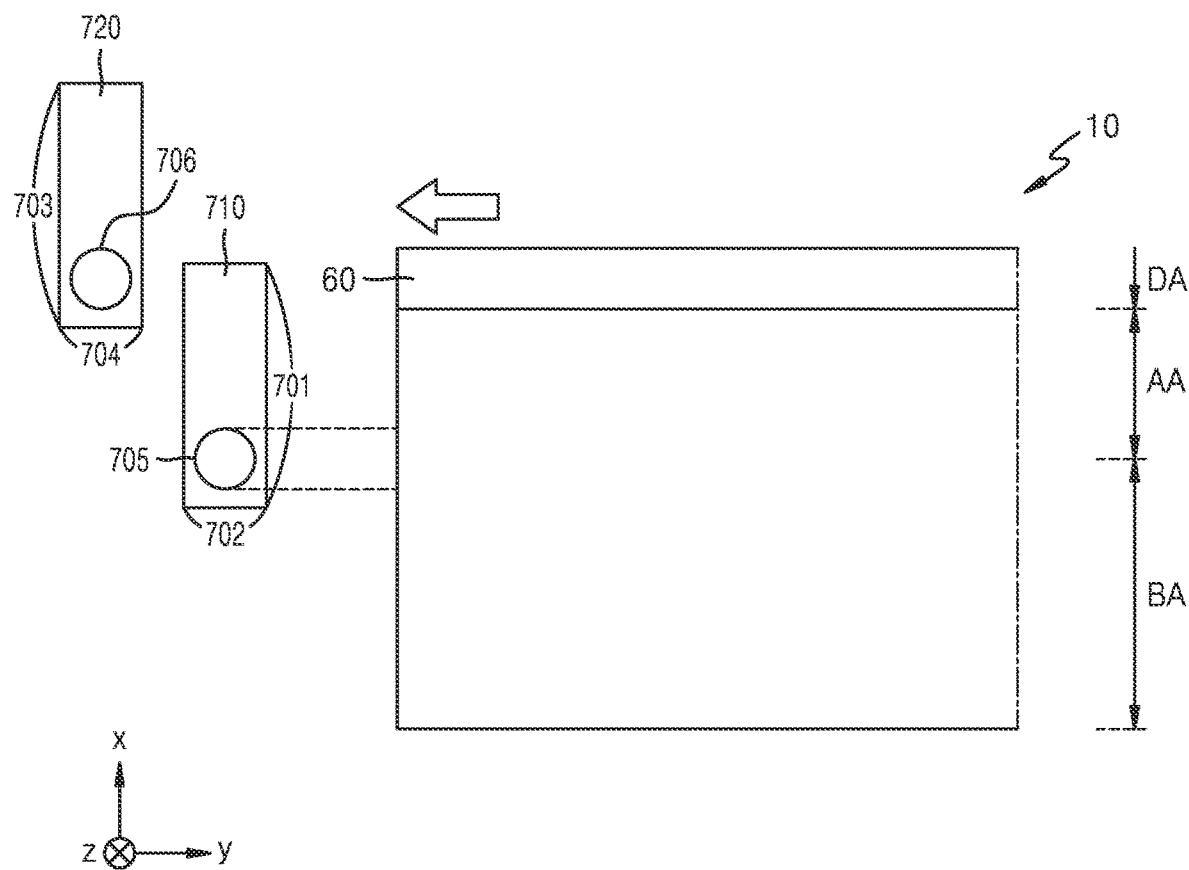
FIGS. 10 to 16 are diagrams schematically illustrating a method of manufacturing a display device, according to some embodiments of the present disclosure.

Referring to FIG. 10, the first applicator 710 may have a rectangular shape including a long side portion 701 and a short side portion 702, and the second applicator 720 may have a rectangular shape including a long side portion 703 and a short side portion 704. The long side portion 701 of the first applicator 710 and the long side portion 703 of the second applicator 720 may each extend in the first direction (e.g., the x direction or the −x direction), and the short side portion 702 of the first applicator 710 and the short side portion 704 of the second applicator 720 may each be spaced apart from each other in the second direction (e.g., the y direction or the −y-direction). However, the disclosure is not limited thereto.

The positions of the first applicator 710 and the second applicator 720 in the first direction (e.g., the x direction or the −x direction) may be changed. Because the positions of the first applicator 710 and the second applicator 720 in the first direction (e.g., the x direction or the −x-direction) are changeable and the stage 700 is movable in the second direction (e.g., the y direction or the −y-direction), the second material 525 and the first material 515 may be simultaneously (or concurrently) applied onto the adjacent area AA and the bending area BA of the display panel 10, respectively. This will be described in more detail below.

The adjacent area AA of the display panel 10 may include a first portion 401 and a second portion 402. The first portion 401 of the adjacent area AA may be closest to the display area DA. The second portion 402 of the adjacent area AA may be between the first portion 401 and the dam 400.

The bending area BA of the display panel 10 may include a third portion 403, a fourth portion 404, a fifth portion 405, and a sixth portion 406. The third portion 403 is closest to the dam 400, and the fourth portion 404, the fifth portion 405, and the sixth portion 406 may be sequentially arranged in the first direction (e.g., the −x direction) in this stated order.

Figure 11:
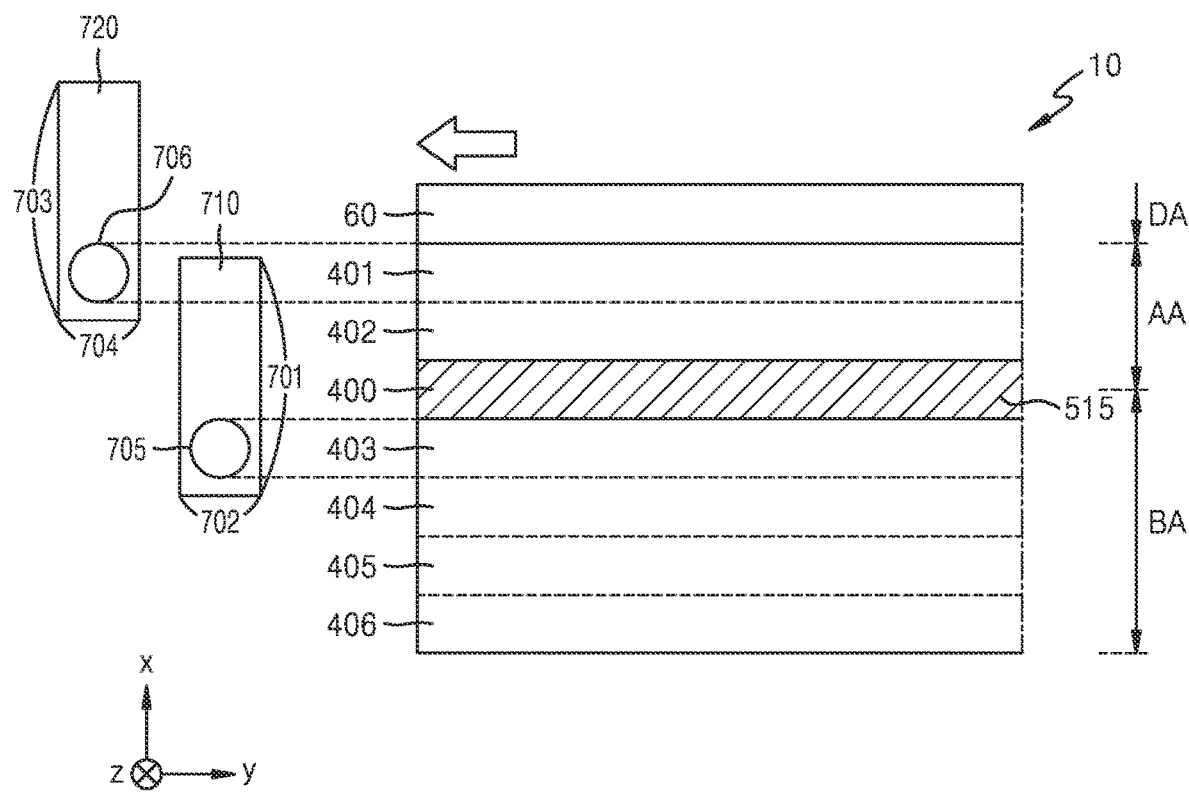

Referring to FIGS. 10 and 11, the dam 400 may be formed on at least a portion of the adjacent area AA and at least a portion of the bending area BA.

According to some embodiments, the first material 515 may be applied onto at least a portion of the adjacent area AA and at least a portion of the bending area BA in the display panel 10. A portion 705 of the first applicator 710, from which the first material 515 is discharged, may be located on a portion including at least a portion of the adjacent area AA and at least a portion of the bending area BA. In other words, the portion 705 of the first applicator 710, from which the first material 515 is discharged, may be between the adjacent area AA and the bending area BA. The stage 700 is movable in the second direction (e.g., the y direction or the −y direction). The display panel 10 located on the stage 700 is also movable in the second direction (e.g., the y direction or the −y direction). The stage 700 may move at a first speed (e.g., about 250 mm/s).

According to some embodiments, the first applicator 710 may discharge the first material 515. The first applicator 710 may uniformly discharge the first material 515 in a first discharge amount. The dam 400 may be formed by applying the first material 515 between the adjacent area AA and the bending area BA of the display panel 10. At this time, the first material 515 applied onto at least a portion of the adjacent area AA and at least a portion of the bending area BA may temporarily cured (e.g., spot-temporarily cured) at the same time as the application to form the dam 400. The dam 400 may extend on at least a portion of the adjacent area AA and at least a portion of the bending area BA in the second direction (e.g., the y direction or the −y direction).

The adjacent area AA of the display panel 10 may include a first portion 401 and a second portion 402. The first portion 401 of the adjacent area AA may be closest to the display area DA. The second portion 402 of the adjacent area AA may be between the first portion 401 and the dam 400.

The bending area BA of the display panel 10 may include a third portion 403, a fourth portion 404, a fifth portion 405, and a sixth portion 406. The third portion 403 is closest to the dam 400, and the fourth portion 404, the fifth portion 405, and the sixth portion 406 may be sequentially arranged in the first direction (e.g., the −x direction) in this stated order.

Figure 12:
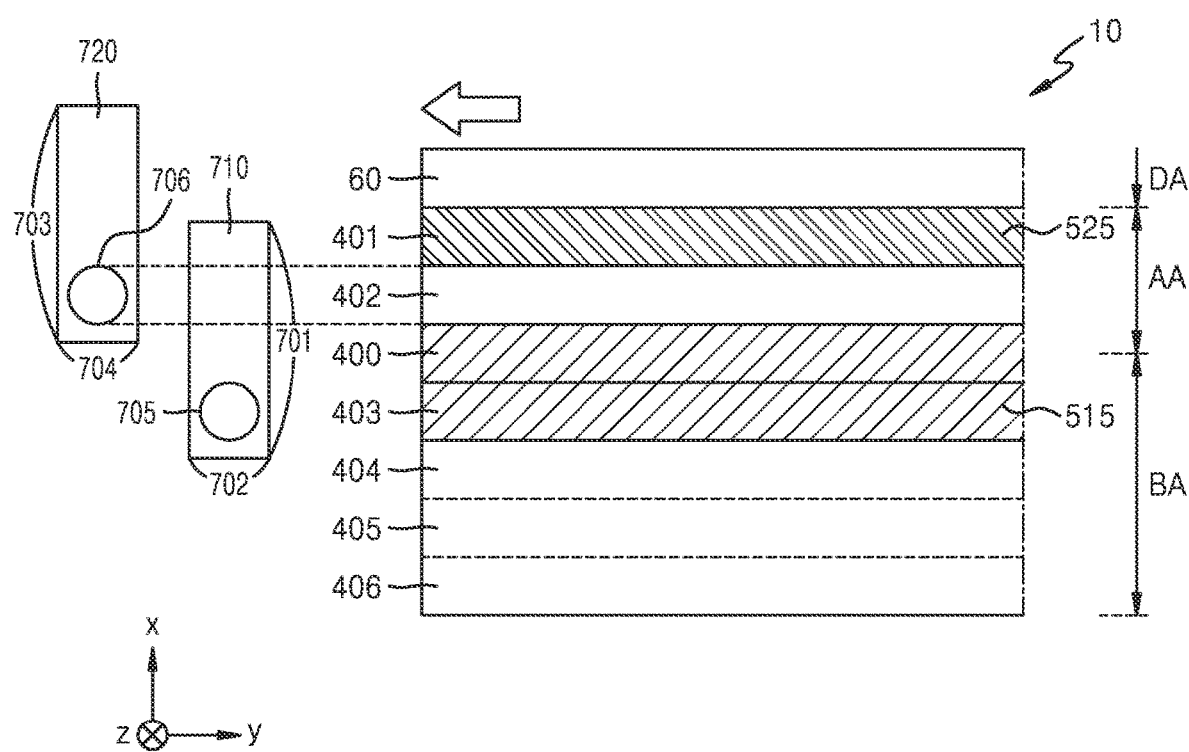

Referring to FIGS. 11 and 12, the first material 515 may be applied onto the bending area BA, and the second material 525 different from the first material 515 may be applied onto the adjacent area AA. In this case, the first material 515 may be discharged from the first applicator 710, and the second material 525 may be discharged from the second applicator 720.

For example, the applying of the first material 515 onto the bending area BA and the second material 525 onto the adjacent area AA may include discharging the first material 515 from the first applicator 710 to the third portion 403 of the bending area BA, and discharging the second material 525 from the second applicator 720 to the first portion 401 of the adjacent area AA.

The discharging of the first material 515 from the first applicator 710 to the third portion 403 of the bending area BA and the discharging of the second material 525 from the second applicator 720 to the first portion 401 of the adjacent area AA may include simultaneously (or concurrently) discharging the first material 515 and the second material 525 from the first applicator 710 and the second applicator 720, respectively. In other words, the second applicator 720 may apply the second material 525 onto the first portion 401 of the adjacent area AA at the same time when the first applicator 710 applies the first material 515 onto the third portion 403 of the bending area BA.

A portion 705 of the first applicator 710, from which the first material 515 is discharged, may be located on the third portion 403, and a portion 706 of the second applicator 720, from which the second material 525 is discharged, may be located on the first portion 401. The first applicator 710 and the second applicator 720 may simultaneously (or concurrently) apply the first material 515 and the second material 525 onto the third portion 403 and the first portion 401, respectively.

According to some embodiments, the stage 700 is movable in the second direction (e.g., the y direction or the −y direction). The display panel 10 located on the stage 700 is also movable in the second direction (e.g., the y direction or the −y direction). The moving speed of the stage 700 may be changed, and the stage 700 may move at a second speed (e.g., about 150 mm/s).

The moving speed of the stage 700 when the first material 515 is applied onto the third portion 403 of the bending area BA may be slower than the moving speed of the stage 700 when the dam 400 is formed. For example, the moving speed of the stage 700 when the first material 515 is applied onto the third portion 403 of the bending area BA may be about 150 mm/s, and the moving speed of the stage 700 when the dam 400 is formed may be about 250 mm/s.

According to some embodiments, the first applicator 710 may discharge the first material 515. The second applicator 720 may discharge the second material 525. The total amount of the first material 515 applied onto the display panel 10 when the dam 400 is formed may be equal to the total amount of the first material 515 applied onto the third portion 403. In other words, the total amount of the first material 515 applied to form the dam 400 may be equal to the total amount of the first material 515 applied onto the third portion 403.

The discharge amount (second discharge amount) of the first material 515 discharged from the first applicator 710 when the first material 515 is applied onto the third portion 403 may be different from the discharge amount (first discharge amount) of the first material 515 discharged from the first applicator 710 when the dam 400 is formed in advance. The discharge amount of the first material 515 discharged from the first applicator 710 may be adjusted according to the moving speed of the stage 700. The first applicator 710 may uniformly discharge the first material 515 in the first discharge amount. Alternatively, the first applicator 710 may uniformly discharge the first material 515 in the second discharge amount. While the stage 700 is moving, the total discharge amount of the first material 515 discharged from the first applicator 710 when the dam 400 is formed may be equal to the total discharge amount of the first material 515 discharged from the first applicator 710 when the first material 515 is applied onto the third portion 403. The moving speed (e.g., 150 mm/s) of the stage 700 when the first material 515 is applied onto the third portion 403 may be slower than the moving speed (e.g., 250 mm/s) of the stage 700 when the dam 400 is formed. In other words, the second discharge amount of the first material 515 discharged from the first applicator 710 when the first material 515 is applied onto the third portion 403 may be less than the first discharge amount of the first material 515 discharged from the first applicator 710 when the dam 400 dam is formed.

According to some embodiments, the first material 515 and the second material 525 may be simultaneously (or concurrently) discharged from the first applicator 710 located on the third portion 403 and the second applicator 720 located on the first portion 401, respectively, and the stage 700 is movable in the second direction (e.g., the –y direction or the y direction). In other words, the second material 525 and the first material 515 may be simultaneously (or concurrently) applied onto the first portion 401 and the third portion 403 of the display panel 10, respectively.

Figure 13:
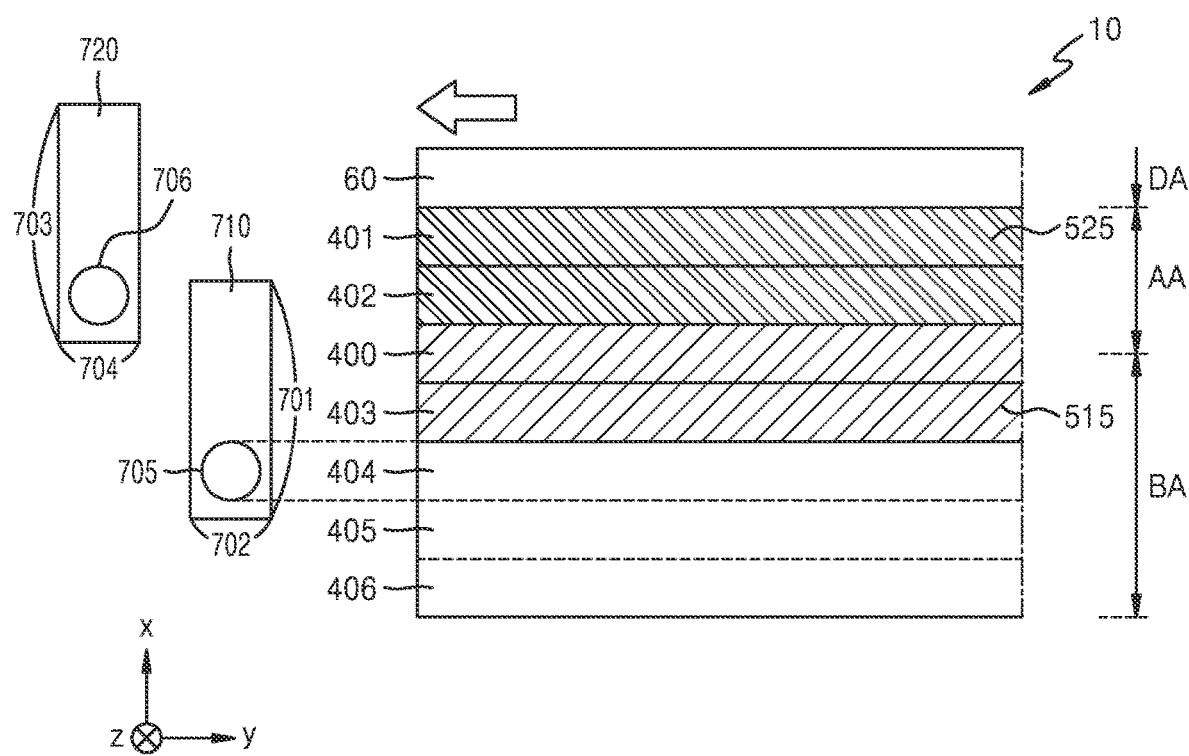

Referring to FIGS. 12 and 13, the second material 525 may be applied onto the second portion 402 of the adjacent area AA. The portion 706 of the second applicator 720, from which the second material 525 is discharged, may be located on the second portion 402.

According to some embodiments, the stage 700 is movable in the second direction (e.g., the y direction or the –y direction). The display panel 10 located on the stage 700 is also movable in the second direction (e.g., the y direction or the –y direction). The stage 700 may move at the second speed (e.g., about 150 mm/s).

The moving speed of the stage 700 when the second material 525 is applied onto the second portion 402 of the adjacent area AA may be equal to the moving speed of the stage 700 when the second material 525 is applied onto the first portion 401 of the adjacent area AA. For example, the moving speed of the stage 700 when the second material 525 is applied onto the second portion 402 of the adjacent area AA may be about 150 mm/s, and the moving speed of the stage 700 when the second material 525 is applied onto the first portion 401 may be about 150 mm/s.

The total amount of the second material 525 applied when the second material 525 is applied onto the second portion 402 of the adjacent area AA may be equal to the total amount of the second material 525 applied when the second material 525 is applied onto the first portion 401. In other words, the total amount of the second material 525 applied onto the first portion 401 may be equal to the total amount of the second material 525 applied onto the second portion 402.

The discharge amount of the second material 525 discharged from the second applicator 720 when the second material 525 is applied onto the second portion 402 of the adjacent area AA may be equal to the discharge amount of the second material 525 discharged from the second applicator 720 when the second material 525 is applied onto the first portion 401.

According to some embodiments, the second material 525 may be discharged from the second applicator 720 located on the second portion 402, and the stage 700 is movable in the second direction (e.g., the –y direction or the y direction). In other words, the second material 525 may be completely applied onto the second portion 402.

Figure 14:
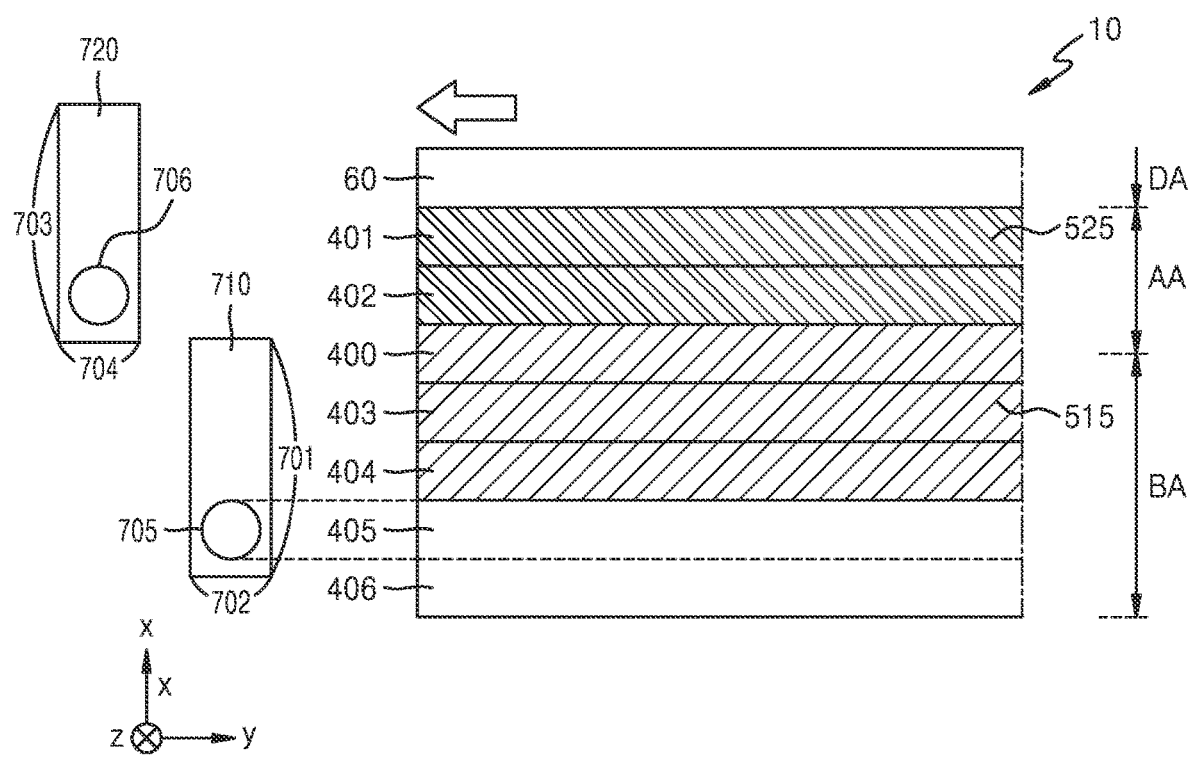

Referring to FIGS. 13 and 14, the first material 515 may be applied onto the fourth portion 404 of the bending area BA. The portion 705 of the first applicator 710, from which the first material 515 is discharged, may be located on the fourth portion 404.

According to some embodiments, the stage 700 is movable in the second direction (e.g., the y direction or the –y direction). The display panel 10 located on the stage 700 is also movable in the second direction (e.g., the y direction or the –y direction). The moving speed of the stage 700 may be changed, and the stage 700 may move at the first speed (e.g., about 250 mm/s).

The moving speed of the stage 700 when the first material 515 is applied onto the fourth portion 404 of the bending area BA may be faster than the moving speed of the stage 700 when the first material 515 is applied onto the third portion 403. For example, the moving speed of the stage 700 when the first material 515 is applied onto the fourth portion 404 may be about 250 mm/s, and the moving speed of the stage 700 when the first material 515 is applied onto the third portion 403 may be about 150 mm/s.

The total amount of the first material 515 applied onto the display panel 10 when the first material 515 is applied onto the fourth portion 404 of the bending area BA may be equal to the total amount of the first material 515 applied onto the display panel 10 when the first material 515 is applied onto the third portion 403. In other words, the total amount of the first material 515 applied onto the fourth portion 404 may be equal to the total amount of the first material 515 applied onto the third portion 403.

According to some embodiments, the discharge amount (first discharge amount) of the first material 515 discharged from the first applicator 710 when the first material 515 is applied onto the fourth portion 404 may be different from the discharge amount (second discharge amount) of the first material 515 discharged from the first applicator 710 when the first material 515 is applied onto the third portion 403. The discharge amount of the first material 515 discharged from the first applicator 710 may be adjusted according to the moving speed of the stage 700.

While the stage 700 is moving, the total discharge amount of the first material 515 discharged from the first applicator 710 when the first material 515 is applied onto the fourth portion 404 may be equal to the total discharge amount of the first material 515 discharged from the first applicator 710 when the first material 515 is applied onto the third portion 403. The moving speed (e.g., about 250 mm/s) of the stage 700 when the first material 515 is applied onto the fourth portion 404 may be faster than the moving speed (e.g., about 150 mm/s) of the stage 700 when the first material 515 is applied onto the third portion 403. The first applicator 710 may uniformly discharge the first material 515 in the first discharge amount. Alternatively, the first applicator 710 may uniformly discharge the first material 515 in the second discharge amount. The first discharge amount and the second discharge amount of the first material 515 discharged from the first applicator 710 may be different from each other. For example, the first discharge amount of the first material 515 discharged from the first applicator 710 when the first material 515 is applied onto the fourth portion 404 may be greater than the second discharge amount of the first material 515 discharged from the first applicator 710 when the first material 515 is applied onto the third portion 403.

According to some embodiments, the first material 515 may be discharged from the first applicator 710 located on the fourth portion 404, and the stage 700 is movable in the second direction (e.g., the –y direction or the y direction). In other words, the first material 515 may be completely and simultaneously (or concurrently) applied onto the fourth portion 404 of the display panel 10.

Figure 15:
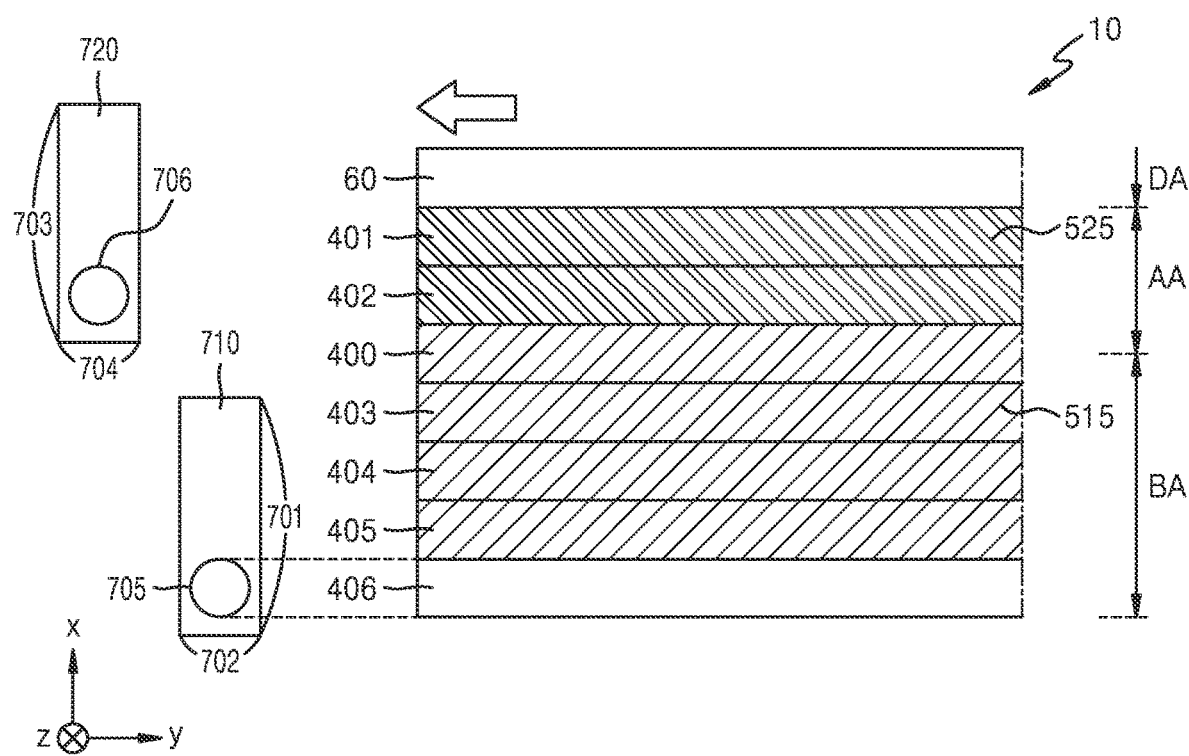

Referring to FIGS. 14 and 15, the first material 515 may be applied onto the fifth portion 405 of the bending area BA. The first applicator 710 may be located on the fifth portion 405.

The stage 700 is movable in the second direction (e.g., the y direction or the −y direction). The display panel 10 located on the stage 700 is also movable in the second direction (e.g., the y direction or the −y direction). The stage 700 may move at the first speed (e.g., about 250 nm/s).

The moving speed of the stage 700 when the first material 515 is applied onto the fifth portion 405 of the bending area BA may be equal to the moving speed of the stage 700 when the first material 515 is applied onto the fourth portion 404. For example, the moving speed of the stage 700 when the first material 515 is applied onto the fifth portion 405 may be about 250 mm/s, and the moving speed of the stage 700 when the first material 515 is applied onto the fourth portion 404 may be about 250 mm/s.

The total amount of the first material 515 applied onto the display panel 10 when the first material 515 is applied onto the fifth portion 405 of the bending area BA may be equal to the total amount of the first material 515 applied onto the display panel when the first material 515 is applied onto the fourth portion 404. In other words, the total amount of the first material 515 applied onto the fifth portion 405 may be equal to the total amount of the first material 515 applied onto the fourth portion 404.

The discharge amount (first discharge amount) of the first material 515 discharged from the first applicator 710 when the first material 515 is applied onto the fifth portion 405 may be equal to the discharge amount (first discharge amount) of the first material 515 discharged from the first applicator 710 when the first material 515 is applied onto the fourth portion 404. The discharge amount of the first material 515 discharged from the first applicator 710 may be adjusted according to the moving speed of the stage 700.

The first applicator 710 may uniformly discharge the first material 515 in the first discharge amount. While the stage 700 is moving, the total discharge amount of the first material 515 discharged from the first applicator 710 when the first material 515 is applied onto the fifth portion 405 may be equal to the total discharge amount of the first material 515 discharged from the first applicator 710 when the first material 515 is applied onto the fourth portion 404. The moving speed (e.g., about 250 mm/s) of the stage 700 when the first material 515 is applied onto the fifth portion 405 may be equal to the moving speed (e.g., about 250 mm/s) of the stage 700 when the first material 515 is applied onto the fourth portion 404. In other words, the discharge amount of the first material 515 discharged from the first applicator 710 when the first material 515 is applied onto the fifth portion 405 may be equal to the discharge amount of the first material 515 discharged from the first applicator 710 when the first material 515 is applied onto the fourth portion 404. For example, the discharge amount of the first material 515 discharged from the first applicator 710 when the first material 515 is applied onto the fifth portion 405 and the fourth portion 404 may be the first discharge amount.

According to some embodiments, the first material 515 may be discharged from the first applicator 710 located on the fifth portion 405, and the stage 700 is movable in the second direction (e.g., the −y direction or the y direction). In other words, the first material 515 may be completely applied onto the fifth portion 405 of the display panel 10.

Figure 16:
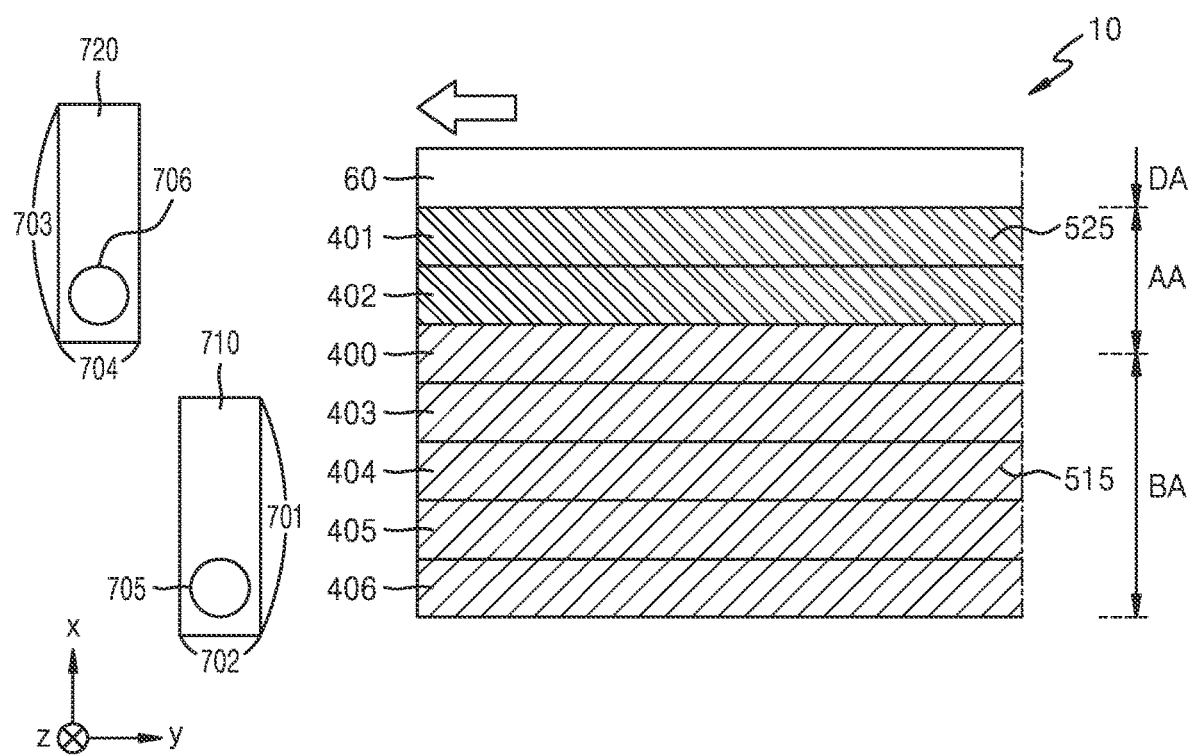

Referring to FIGS. 15 and 16, the first material 515 may be applied onto the sixth portion 406 of the bending area BA. The first applicator 710 may be located on the sixth portion 406. The stage 700 is movable in the second direction (e.g., the y direction or the −y direction). The display panel 10 located on the stage 700 is also movable in the second direction (e.g., the y direction or the −y direction). The stage 700 may move at the first speed (e.g., about 250 nm/s).

The moving speed of the stage 700 when the first material 515 is applied onto the sixth portion 406 of the bending area BA may be equal to the moving speed of the stage 700 when the first material 515 is applied onto the fifth portion 405. For example, the moving speed of the stage 700 when the first material 515 is applied onto the sixth portion 406 may be about 250 mm/s, and the moving speed of the stage 700 when the first material 515 is applied onto the fifth portion 405 may be about 250 mm/s.

The total amount of the first material 515 applied onto the display panel 10 when the first material 515 is applied onto the sixth portion 406 of the bending area BA may be equal to the total amount of the first material 515 applied onto the display panel 10 when the first material 515 is applied onto the fifth portion 405. In other words, the total amount of the first material 515 applied onto the sixth portion 406 may be equal to the total amount of the first material 515 applied onto the fifth portion 405.

The discharge amount (first discharge amount) of the first material 515 discharged from the first applicator 710 when the first material 515 is applied onto the sixth portion 406 of the bending area BA may be equal to the discharge amount (first discharge amount) of the first material 515 discharged from the first applicator 710 when the first material 515 is applied onto the fifth portion 405. The discharge amount of the first material 515 discharged from the first applicator 710 may be adjusted according to the moving speed of the stage 700.

The first applicator 710 may uniformly discharge the first material 515 in the first discharge amount. While the stage 700 is moving, the total discharge amount of the first material 515 discharged from the first applicator 710 when the first material 515 is applied onto the sixth portion 406 may be equal to the total discharge amount of the first material 515 discharged from the first applicator 710 when the first material 515 is applied onto the fifth portion 405. The moving speed (e.g., about 250 mm/s) of the stage 700 when the first material 515 is applied onto the sixth portion 406 may be equal to the moving speed (e.g., about 250 mm/s) of the stage 700 when the first material 515 is applied onto the fifth portion 405. In other words, the discharge amount of the first material 515 discharged from the first applicator 710 when the first material 515 is applied onto the sixth portion 406 may be equal to the discharge amount of the first material 515 discharged from the first applicator 710 when the first material 515 is applied onto the fifth portion 405. For example, the discharge amount of the first material 515 discharged from the first applicator 710 when the first material 515 is applied onto the sixth portion 406 and the fifth portion 405 may be the first discharge amount.

According to some embodiments, the first material 515 may be discharged from the first applicator 710 located on the sixth portion 406, and the stage 700 is movable in the second direction (e.g., the −y direction or the y direction). In other words, the first material 515 may be completely applied onto the sixth portion 406 of the display panel 10.

In the display area DA, the bending area BA, and the adjacent area AA between the display area DA and the bending area BA in the display panel 10, materials may be applied onto the adjacent area AA and the bending area BA. The material applied onto the adjacent area AA may be different from the material applied onto the bending area BA. The materials may be applied from different applicators from each other. Because the first material 515 and the second material 525 are simultaneously (or concurrently) applied onto the bending area BA and the adjacent area AA, respectively, the time required to apply the materials may be shortened. Therefore, application efficiency may be improved, and the process time for manufacturing the display device may be shortened.

According to one or more embodiments, an apparatus for manufacturing a display device and a method of manufacturing a display device, in which facility efficiency is improved through simultaneous (or concurrent) application, may be implemented. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. An apparatus for manufacturing a display device, the apparatus comprising:
    a display panel comprising a display area, an adjacent area surrounding the display area, and a bending area extending from one side of the adjacent area;
    a stage on which the display panel is located;
    a first applicator configured to discharge a first material to the bending area of the display panel; and
    a second applicator configured to discharge a second material to the adjacent area of the display panel, the second material being different from the first material,
    wherein a position of at least one of the first applicator or the second applicator is changeable in a first direction.

2. The apparatus of claim 1, wherein the display panel further comprises a dam on at least a portion of the adjacent area and at least a portion of the bending area.

3. The apparatus of claim 2, wherein the dam includes a same material as the first material.

4. The apparatus of claim 2, wherein the adjacent area comprises a first portion adjacent to the display area, and a second portion between the first portion and the dam.

5. The apparatus of claim 4, wherein the bending area comprises a third portion and a fourth portion, the third portion is adjacent to the dam, and
    a shortest distance from the third portion to the adjacent area in the first direction is less than a shortest distance from the fourth portion to the adjacent area in a plan view.

6. The apparatus of claim 5, wherein the second applicator applies the second material onto the first portion of the adjacent area at a same time when the first applicator applies the first material onto the third portion of the bending area.

7. The apparatus of claim 1, wherein a moving speed of the stage is changeable.

8. The apparatus of claim 3, wherein a discharge amount of the first material discharged from the first applicator is configured to be adjusted according to a moving speed of the stage.

9. A method of manufacturing a display device, the method comprising:
    placing a display panel on a stage, the display panel comprising a display area, an adjacent area surrounding the display area, and a bending area extending from one side of the adjacent area;
    forming a dam on at least a portion of the adjacent area and at least a portion of the bending area; and
    applying a first material onto the bending area and a second material onto the adjacent area, the second material being different from the first material.

10. The method of claim 9, wherein the dam includes a same material as the first material.

11. The method of claim 9, wherein the first material is discharged from a first applicator.

12. The method of claim 11, wherein the second material is discharged from a second applicator.

13. The method of claim 12, wherein the adjacent area comprises a first portion adjacent to the display area, and a second portion between the first portion and the dam.

14. The method of claim 13, wherein the bending area comprises a third portion and a fourth portion,
    the third portion is adjacent to the dam, and
    a shortest distance from the third portion to the adjacent area in a first direction is less than a shortest distance from the fourth portion to the adjacent area in a plan view.

15. The method of claim 14, wherein the applying of the first material onto the bending area and the second material onto the adjacent area comprises discharging the first material from the first applicator to the third portion of the bending area, and discharging the second material from the second applicator to the first portion of the adjacent area.

16. The method of claim 15, wherein, in the applying of the first material onto the bending area and the second material onto the adjacent area,
    the first material and the second material are concurrently discharged from the first applicator and the second applicator, respectively.

17. The method of claim 15, further comprising:
    after the applying of the first material onto the bending area and the second material onto the adjacent area,
    discharging the second material from the second applicator to the second portion of the adjacent area; and
    discharging the first material from the first applicator to the fourth portion of the bending area.

18. The method of claim 14, further comprising moving the stage in a second direction crossing the first direction.

19. The method of claim 18, further comprising changing a moving speed of the stage.

20. The method of claim 11, further comprising adjusting a discharge amount of the first material discharged from the first applicator according to a moving speed of the stage.

* * * * *